(12) United States Patent
Tortorelli et al.

(10) Patent No.: US 12,514,138 B2
(45) Date of Patent: Dec. 30, 2025

(54) DOPANT-MODULATED ETCHING FOR MEMORY DEVICES

(71) Applicant: Micron Technology, Inc., Boise, ID (US)

(72) Inventors: Innocenzo Tortorelli, Cernusco sul Naviglio (IT); Mattia Robustelli, Milan (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/374,925

(22) Filed: Sep. 29, 2023

(65) Prior Publication Data
US 2024/0049610 A1 Feb. 8, 2024

Related U.S. Application Data

(62) Division of application No. 17/069,380, filed on Oct. 13, 2020, now Pat. No. 11,800,816, which is a
(Continued)

(51) Int. Cl.
*H10N 70/00* (2023.01)
*H10B 63/00* (2023.01)
*H10N 70/20* (2023.01)

(52) U.S. Cl.
CPC .......... *H10N 70/063* (2023.02); *H10B 63/84* (2023.02); *H10N 70/043* (2023.02);
(Continued)

(58) Field of Classification Search
CPC .. H10N 70/063; H10N 70/043; H10N 70/245; H10N 70/826; H10N 70/882;
(Continued)

(56) References Cited

U.S. PATENT DOCUMENTS 6,297,161 B1 * 10/2001 Sah .................... H10D 30/6743
257/E21.414
7,049,652 B2    5/2006 Mokhlesi et al.
(Continued)

FOREIGN PATENT DOCUMENTS

CN    101110467 A    1/2008
CN    101228619 A    7/2008
(Continued)

OTHER PUBLICATIONS

Yin, Qi, et al, "Research and Application Prospects of Phase Change Memory Materials," New material industry, No. 7, Jul. 5, 2016.
(Continued)

*Primary Examiner* — Thanh T Nguyen
(74) *Attorney, Agent, or Firm* — Holland & Hart LLP

(57) ABSTRACT

Methods and devices based on the use of dopant-modulated etching are described. During fabrication, a memory storage element of a memory cell may be non-uniformly doped with a dopant that affects a subsequent etching rate of the memory storage element. After etching, the memory storage element may have an asymmetric geometry or taper profile corresponding to the non-uniform doping concentration. A multi-deck memory device may also be formed using dopant-modulated etching. Memory storage elements on different memory decks may have different taper profiles and different doping gradients.

19 Claims, 11 Drawing Sheets

Related U.S. Application Data division of application No. 15/893,110, filed on Feb. 9, 2018, now Pat. No. 10,854,813.

(52) U.S. Cl.
CPC ......... H10N 70/245 (2023.02); H10N 70/826 (2023.02); *H10B 63/20* (2023.02); *H10N 70/882* (2023.02)

(58) Field of Classification Search
CPC ........ H10N 70/24; H10B 63/84; H10B 63/20; H01L 27/0207; H01L 21/306; H01L 27/06
See application file for complete search history.

(56) References Cited

U.S. PATENT DOCUMENTS

| | | | |
|---|---|---|---|
| 7,189,631 | B2 | 3/2007 | Yamazaki et al. |
| 7,547,612 | B2 | 6/2009 | Yamazaki et al. |
| 7,550,313 | B2 | 6/2009 | Arnold et al. |
| 7,723,692 | B2 | 5/2010 | Miyake et al. |
| 7,923,348 | B2 | 4/2011 | Yamazaki et al. |
| 8,153,488 | B2 | 4/2012 | Nishitani et al. |
| 8,179,713 | B2 | 5/2012 | Kanzawa et al. |
| 8,222,677 | B2 | 7/2012 | Baba et al. |
| 8,502,343 | B1* | 8/2013 | Jha ................ H10N 70/026 257/536 |
| 8,625,325 | B2 | 1/2014 | An et al. |
| 8,847,186 | B2 | 9/2014 | Redaelli et al. |
| 9,257,431 | B2 | 2/2016 | Ravasio et al. |
| 9,337,422 | B2 | 5/2016 | Cheong et al. |
| 9,607,691 | B1 | 3/2017 | Allegra et al. |
| 9,640,588 | B2 | 5/2017 | Sciarrillo et al. |
| 9,799,381 | B1 | 10/2017 | Tortorelli et al. |
| 10,096,576 | B1 | 10/2018 | Kinsley |
| 10,424,374 | B2 | 9/2019 | Redaelli et al. |
| 10,424,730 | B2 | 9/2019 | Pirovano et al. |
| 10,854,813 | B2 | 12/2020 | Tortorelli et al. |
| 10,868,248 | B2 | 12/2020 | Pirovano et al. |
| 2005/0127428 | A1 | 6/2005 | Mokhlesi et al. |
| 2005/0254291 | A1 | 11/2005 | Happ et al. |
| 2006/0157683 | A1 | 7/2006 | Scheuerlein |
| 2006/0273404 | A1 | 12/2006 | Scheuerlein |
| 2007/0010082 | A1 | 1/2007 | Pinnow et al. |
| 2007/0034878 | A1 | 2/2007 | Kato et al. |
| 2007/0054460 | A1 | 3/2007 | Enicks |
| 2007/0063180 | A1 | 3/2007 | Asano et al. |
| 2007/0097739 | A1* | 5/2007 | Happ ................ H10N 70/828 365/163 |
| 2007/0125953 | A1 | 6/2007 | Miyake et al. |
| 2007/0238225 | A1 | 10/2007 | Wicker |
| 2007/0246782 | A1 | 10/2007 | Philipp et al. |
| 2008/0017894 | A1 | 1/2008 | Happ et al. |
| 2008/0019170 | A1 | 1/2008 | Happ et al. |
| 2008/0044632 | A1 | 2/2008 | Liu et al. |
| 2008/0191188 | A1 | 8/2008 | Jeong |
| 2008/0239788 | A1 | 10/2008 | Markert et al. |
| 2008/0246014 | A1 | 10/2008 | Lung |
| 2009/0020739 | A1 | 1/2009 | Arnold et al. |
| 2009/0134431 | A1 | 5/2009 | Tabata et al. |
| 2009/0231911 | A1* | 9/2009 | Liu ................ H10N 70/826 257/E47.001 |
| 2009/0251944 | A1 | 10/2009 | Happ et al. |
| 2009/0275196 | A1 | 11/2009 | Yamazaki et al. |
| 2010/0032725 | A1 | 2/2010 | Baba et al. |
| 2010/0044664 | A1* | 2/2010 | Liu ................ H10N 70/826 257/E47.001 |
| 2010/0202186 | A1 | 8/2010 | Sato et al. |
| 2010/0243980 | A1 | 9/2010 | Fukumizu |
| 2010/0259966 | A1 | 10/2010 | Kanzawa et al. |
| 2010/0284212 | A1 | 11/2010 | Bedeschi et al. |
| 2010/0295010 | A1 | 11/2010 | Tio et al. |
| 2010/0328996 | A1 | 12/2010 | Shih et al. |
| 2011/0032753 | A1 | 2/2011 | An et al. |
| 2011/0037045 | A1 | 2/2011 | Fukumizu et al. |
| 2011/0155984 | A1 | 6/2011 | Redaelli et al. |
| 2012/0069645 | A1 | 3/2012 | Goux et al. |
| 2012/0193595 | A1* | 8/2012 | Cheng ................ C23C 14/3414 204/192.1 |
| 2012/0223287 | A1 | 9/2012 | Li |
| 2012/0235109 | A1 | 9/2012 | Nojiri |
| 2012/0282752 | A1 | 11/2012 | Lee et al. |
| 2014/0034892 | A1* | 2/2014 | Erbetta ................ H10N 70/043 257/E47.001 |
| 2014/0256110 | A1 | 9/2014 | Lung et al. |
| 2014/0299833 | A1 | 10/2014 | Cheong et al. |
| 2014/0319442 | A1 | 10/2014 | Hayashi |
| 2014/0369113 | A1 | 12/2014 | Krebs et al. |
| 2015/0028280 | A1 | 1/2015 | Sciarrillo et al. |
| 2015/0090052 | A1 | 4/2015 | Dawson et al. |
| 2015/0090952 | A1 | 4/2015 | Huang |
| 2015/0200368 | A1 | 7/2015 | Lee et al. |
| 2015/0243708 | A1 | 8/2015 | Ravasio et al. |
| 2015/0249112 | A1 | 9/2015 | Takeguchi et al. |
| 2015/0255507 | A1 | 9/2015 | Pakala et al. |
| 2015/0325289 | A1 | 11/2015 | Castro |
| 2015/0364681 | A1 | 12/2015 | Murase et al. |
| 2015/0372227 | A1 | 12/2015 | Liu |
| 2016/0013406 | A1 | 1/2016 | Lee et al. |
| 2016/0020256 | A1 | 1/2016 | Sciarrillo et al. |
| 2016/0020389 | A1 | 1/2016 | Ratnam et al. |
| 2017/0018676 | A1 | 1/2017 | Engelhardt et al. |
| 2017/0040533 | A1 | 2/2017 | Marsh et al. |
| 2017/0069378 | A1* | 3/2017 | Shifren .............. G11C 13/0002 |
| 2017/0117467 | A1 | 4/2017 | Chang et al. |
| 2017/0125097 | A1 | 5/2017 | Tortorelli et al. |
| 2017/0207387 | A1 | 7/2017 | Yang et al. |
| 2017/0244026 | A1 | 8/2017 | Wu et al. |
| 2017/0263862 | A1 | 9/2017 | Bernhardt et al. |
| 2017/0271581 | A1 | 9/2017 | Seong et al. |
| 2017/0346003 | A1 | 11/2017 | Liu |
| 2019/0058109 | A1 | 2/2019 | Chen et al. |
| 2019/0096461 | A1 | 3/2019 | Koike et al. |
| 2019/0252605 | A1 | 8/2019 | Redaelli et al. |
| 2021/0091140 | A1 | 3/2021 | Ravasio et al. |

FOREIGN PATENT DOCUMENTS

| | | |
|---|---|---|
| CN | 101512788 A | 8/2009 |
| CN | 101536156 A | 9/2009 |
| CN | 101663770 A | 3/2010 |
| CN | 101937970 A | 1/2011 |
| CN | 102124565 A | 7/2011 |
| CN | 103746073 A | 4/2014 |
| CN | 105531820 A | 4/2016 |
| CN | 106104814 A | 11/2016 |
| CN | 107104182 A | 8/2017 |
| CN | 107204351 A | 9/2017 |
| EP | 1783844 A2 | 5/2007 |
| EP | 3742507 A1 | 11/2020 |
| JP | 2007-288201 A | 11/2007 |
| JP | 2008-198979 A | 8/2008 |
| JP | 2009-117668 A | 5/2009 |
| JP | 2009-130138 A | 6/2009 |
| JP | 2009-218259 A | 9/2009 |
| JP | 2010-186872 A | 8/2010 |
| JP | 2010-232214 A | 10/2010 |
| JP | 2011-139057 A | 7/2011 |
| JP | 2011-216768 A | 10/2011 |
| JP | 2012-160710 A | 8/2012 |
| JP | 2013-016530 A | 1/2013 |
| JP | 2013-130138 A | 7/2013 |
| JP | 2014-528656 A | 10/2014 |
| JP | 2016-015477 A | 1/2016 |
| JP | 2017-510983 A | 4/2017 |
| KR | 10-1995-0027954 A | 10/1995 |
| KR | 10-2007-0047724 A | 5/2007 |
| KR | 10-2007-0103699 A | 10/2007 |
| KR | 10-0810617 B1 | 3/2008 |
| KR | 10-2009-0077232 A | 7/2009 |
| KR | 10-2011-0033956 A | 4/2011 |
| KR | 10-2015-0008515 A | 1/2015 |
| KR | 10-2015-0085155 A | 7/2015 |

(56) References Cited

FOREIGN PATENT DOCUMENTS

| | | | |
|---|---|---|---|
| KR | 10-2016-0006028 A | 1/2016 |
| KR | 10-2016-0113188 A | 9/2016 |
| KR | 10-1952879 B1 | 2/2019 |
| TW | 200409367 A | 6/2004 |
| TW | 200414521 A | 8/2004 |
| TW | 200417033 A | 9/2004 |
| TW | 200805632 A | 1/2008 |
| TW | 200820469 A | 5/2008 |
| TW | 200822294 A | 5/2008 |
| TW | 200908288 A | 2/2009 |
| TW | 201222827 A | 6/2012 |
| TW | 201440178 A | 10/2014 |
| TW | 201503287 A | 1/2015 |
| TW | 201606770 A | 2/2016 |
| TW | 201735040 A | 10/2017 |
| WO | 2008/027279 A2 | 3/2008 |
| WO | 2009/110120 A1 | 9/2009 |
| WO | 2012/114744 A1 | 8/2012 |
| WO | 2015/013478 A1 | 1/2015 |
| WO | 2015/130455 A1 | 9/2015 |
| WO | 2018/200312 A1 | 11/2018 |

OTHER PUBLICATIONS

Burr, Geoffrey W et al., "Access devices for 3D crosspoint memory," Journal of Vacuum Science & Technology: Microelectronics and Nanometer Structures, American Institute of Physics, vol. 32, No. 4, Jul. 24, 2014, Melville, NY (23 pages).

Chen, et al., "An Access-Transistor-Free (0T/1R) Non-Volatile Resistance Random Access Memory (RRAM) Using a Novel Threshold Switching, Self-Rectifying Chalcogenide Device", Electron Devices Meeting, 2003. IEDM '03 Technical.

China National Intellectual Property Administration "First Office Action," issued in connection with Chinese Application No. 201980011249.3, dated Mar. 22, 2021 (16 pages with translation).

Chinese Patent Office, "Office Action and Search Report", issued in connection with Chinese Patent Application No. 201910103073.6 dated Aug. 31, 2022 (20 pages).

Chinese Patent Office, "Office Action and Search Report", issued in connection with Chinese Patent Application No. 201880027808.5 dated Oct. 24, 2022 (15 pages) (7 pages of English Translation and 8 pages of Original Document).

Chinese Patent Office, "Office Action", issued in connection with Chinese Patent Application No. 201980011242.1 dated Jan. 19, 2023 (15 pages) (9 pages of English Translation and 6 pages of Original Document).

Chinese Patent Office, "Office Action", issued in connection with Chinese Patent Application No. 201980011809.5 dated Jan. 19, 2023 (15 pages) (7 pages of English Translation and 8 pages of Original Document).

Chinese Patent Office, "Notice of Allowance," issued in connection with Chinese Patent Application No. 201880027808.5 dated Jun. 30, 2023 (9 pages) (5 pages of English Translation and 4 pages of Original Document).

Chinese Patent Office, "Office Action," issued in connection with Chinese Patent Application No. 201880027808.5 dated Apr. 19, 2023 (12 pages) (4 pages of English Translation and 8 pages of Original Document).

Chinese Patent Office, "Office Action," issued in connection with Chinese Patent Application No. 202210926405.2 dated Apr. 19, 2023 (6 pages of English Translation and 7 pages of Original Document).

European Patent Office, "Extended Search Report," issued in connection with European Patent Application No. 19751003.5, dated Sep. 24, 2021 (10 pages).

European Patent Office, "Extended Search Report," issued in connection with European Patent Application No. 19752050.5, dated Oct. 7, 2021 (7 pages).

European Patent Office, "Extended Search Report," issued in connection with European Patent Application No. 19751568.7, dated May 7, 2021 (6 pages).

European Patent Office, "Search Report," issued in connection with European Patent Application No. 18790479.2, dated Nov. 27, 2020 (10 pages).

Giovanni Betti Betti Beneventi, "Physics-Based Statistical Modeling of PCM Current Drift Including Negative-Drift-Coefficients," IEEE Electron Device Letters, Jul. 14, 2013.

Intellectual Property Office of Singapore, "Written Opinion," issued in connection with Patent Application No. 11201909850P, dated Sep. 25, 2020 (10 pages).

International Search Report and Written Opinion received for PCT Patent Application No. PCT/US19/15671, mailed on May 14, 2019, 13 pages.

International Search Report and Written Opinion received for PCT Patent Application No. PCT/US19/15678, mailed on May 15, 2019, 13 pages.

International Search Report and Written Opinion received for PCT Patent Application No. PCT/US19/15683, mailed on May 15, 2019, 11 pages.

International Search Report and Written Opinion received for PCT Patent Application No. PCT/US2018/028391, mailed on Aug. 9, 2018, 12 pages.

IPO, "Office Action," issued in connection with ROC (Taiwan) Patent Application No. 108103433, dated Jun. 25, 2021 (10 pages with translation).

IPO, "Office Action," issued in connection with ROC (Taiwan) Patent Application No. 108103433, dated Oct. 17, 2019 (6 pages).

IPO, "Office Action," issued in connection with ROC (Taiwan) Patent Application No. 107114369, dated Apr. 19, 2019 (9 pages).

Japan Patent Office, "Decision to Grant a Patent", issued in connection with Japan Patent Application No. 2020-541947 dated Jul. 19, 2022 (6 pages).

Japan Patent Office, "Decision to Grant a Patent", issued in connection with Japan Patent Application No. 2020-542746 dated May 10, 2022 (5 pages).

Japan Patent Office, "Notice of Rejection Ground," issued in connection with Japanese Patent Application No. 2019- 557593, dated Dec. 15, 2020 (9 pages).

Japan Patent Office, "Notice of Rejection Ground," issued in connection with Japanese Patent Application No. 2020-542746, dated Sep. 21, 2021 (6 pages).

Japan Patent Office, "Office Action," issued in connection with Japanese Patent Application No. 2020-541947, dated Aug. 17, 2021 (37 pgs.).

Japanese Patent Office, "Decision to Grant a Patent," issued in connection with Japanese Patent Application No. 2019-557593, dated Jun. 22, 2021 (5 pages with translation).

Japanese Patent Office, "Office Action," issued in connection with Japanese Patent Application No. 2022-092613 dated Jul. 18, 2023 (18 pages) (10 pages of English Translation and 8 pages of Original Document).

Korean Intellectual Property Office, "Notice of Allowance," issued in connection with Korean Patent Application No. 10-2019-7033436, dated Feb. 4, 2021 (4 pages).

Korean Intellectual Property Office, "Notice of Reasons for Rejection," issued in connection with Korean Patent Application No. 10-2019-7033436, dated Sep. 22, 2020 (7 pages).

Korean Patent Office, "Notice of Allowance," issued in connection with Korean Patent Application No. 10-2020-7022822 dated Jul. 28, 2022 (4 pages).

Korean Patent Office, "Notice of Allowance," issued in connection with Korean Patent Application No. 10-2020-7025199 dated Aug. 7, 2022 (4 pages).

Korean Patent Office, "Notice of Allowance," issued in connection with Korean Patent Application No. 10-2020-7025924 dated Jul. 6, 2022 (4 pages).

Lee F M et al: "A Novel Cross Point One-Resistor (OTIR) Conductive Bridge Random Access Memory (CBRAM) with Ultra Low Set/Reset Operation Current", IEEE Symposium on VLSI Technology, Jun. 12-14, 2012, Honolulu, HI, USA 2012, pp. 67-68, XP032204497.

(56) References Cited

OTHER PUBLICATIONS

Luo, Qing, et al., "Demonstration of 3D Vertical RRAM with Ultra Low-leakage, High-selectivity and Self-compliance memory cells," 2015 IEEE International Electron Devices Meeting, Dec. 7, 2015 (4 pages).

Notification of Reason for Refusal received for Korean Patent Application No. 10-2020-7025199, mailed on Dec. 30, 2021, 13 pages (7 pages of English Translation and 6 pages of Original Document).

Notification of Reason for Refusal received for Korean Patent Application No. 10-2020-7025924, mailed on Dec. 31, 2021, 7 pages (4 pages of English Translation and 3 pages of Original Document).

Office Action received for Chinese Patent Application No. 201980011249, mailed on Oct. 29, 2021, 7 pages (4 pages of English Translation and 3 pages of Original Document).

Office Action received for Chinese Patent Application No. 201980011249.3, mailed on Mar. 8, 2022, 5 pages.

Office Action received for Japanese Patent Application No. 2020-541947, mailed on Jan. 25, 2022, 18 pages (9 pages of English Translation and 9 pages of Original Document).

Office Action received for Korean Patent Application No. 10-2020-7022822, mailed on Jan. 28, 2022, 13 pages (7 pages of English Translation and 6 pages of Original Document).

Operation Current, IEEE Symposium on VLSI Technology, Jun. 12-14, 2012, Honolulu, HI, USA, 2012 (pp. 67-68).

Semiconductor Science Tehnology, IP Publishing Ltd., vol. 29, No. 10, Sep. 18, 2014 (11 pages).

Shenoy, Rohit S., et al., "MIEC (mixed-ionic-electrnoic-conduction)-based access devices for non-volatile crossbar memory arrays," Semiconductor Science Tehnology, IP Publishing Ltd., vol. 29, No. 10, Sep. 18, 2014 (11 pages).

Taiwanese Patent Office, "Office Action," issued in connection with Taiwanese Patent Application No. 110138323 dated Apr. 6, 2022 (4 pages).

U.S. Appl. No. 15/582,329, filed Apr. 28, 2017.

U.S. Appl. No. 15/621,939, filed Nov. 4, 2015.

Xu, Le, et al, "High reliability multi-value storage method under 2B2R structure," Fudan Journal (Natural Science Edition), No. 2, Apr. 15, 2010.

Japan Patent Office, "JP Decision to Grant," issued in connection with Japan Patent Application No. 2022-092613 dated Jan. 9, 2024 (6 pages) (2 pages of English Translation and 4 pages of Original Document).

\* cited by examiner

DOPANT-MODULATED ETCHING FOR MEMORY DEVICES

CROSS REFERENCE

The present Application for Patent is a divisional of U.S. patent application Ser. No. 17/069,380, by Tortorelli et al., entitled "DOPANT-MODULATED ETCHING FOR MEMORY DEVICES," filed Oct. 13, 2020, which is a divisional of U.S. patent application Ser. No. 15/893,110, by Tortorelli et al., entitled "DOPANT-MODULATED ETCHING FOR MEMORY DEVICES," filed Feb. 9, 2018, each of which is assigned to the assignee hereof, and each of which is expressly incorporated by reference in its entirety herein.

BACKGROUND

The following relates generally to memory devices that may be formed by using a dopant to control the amount of etching of memory cells in a memory device, and more specifically to dopant-modulated etching for self-selecting memory devices.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Multiple types of memory devices exist, including magnetic hard disks, random access memory (RAM), dynamic RAM (DRAM), synchronous dynamic RAM (SDRAM), ferroelectric RAM (FeRAM), magnetic RAM (MRAM), resistive RAM (RRAM), read only memory (ROM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. Memory devices may be improved by increasing memory cell density, increasing read/write speeds, increasing reliability, increasing data retention, reducing power consumption, or reducing manufacturing costs, for example.

Some types of memory devices may use variations in resistance across a cell to program and sense different logic states. For example, in a self-selecting memory (SSM) cell a logic state may be stored based on a distribution of ions within the memory cell. The physical geometry of the memory cell may affect the distribution of ions of the cell, which, in turn, may affect a threshold voltage of the cell. The threshold voltage may be related to or indicative of the logic state of the cell.

DETAILED DESCRIPTION

Figure 1:
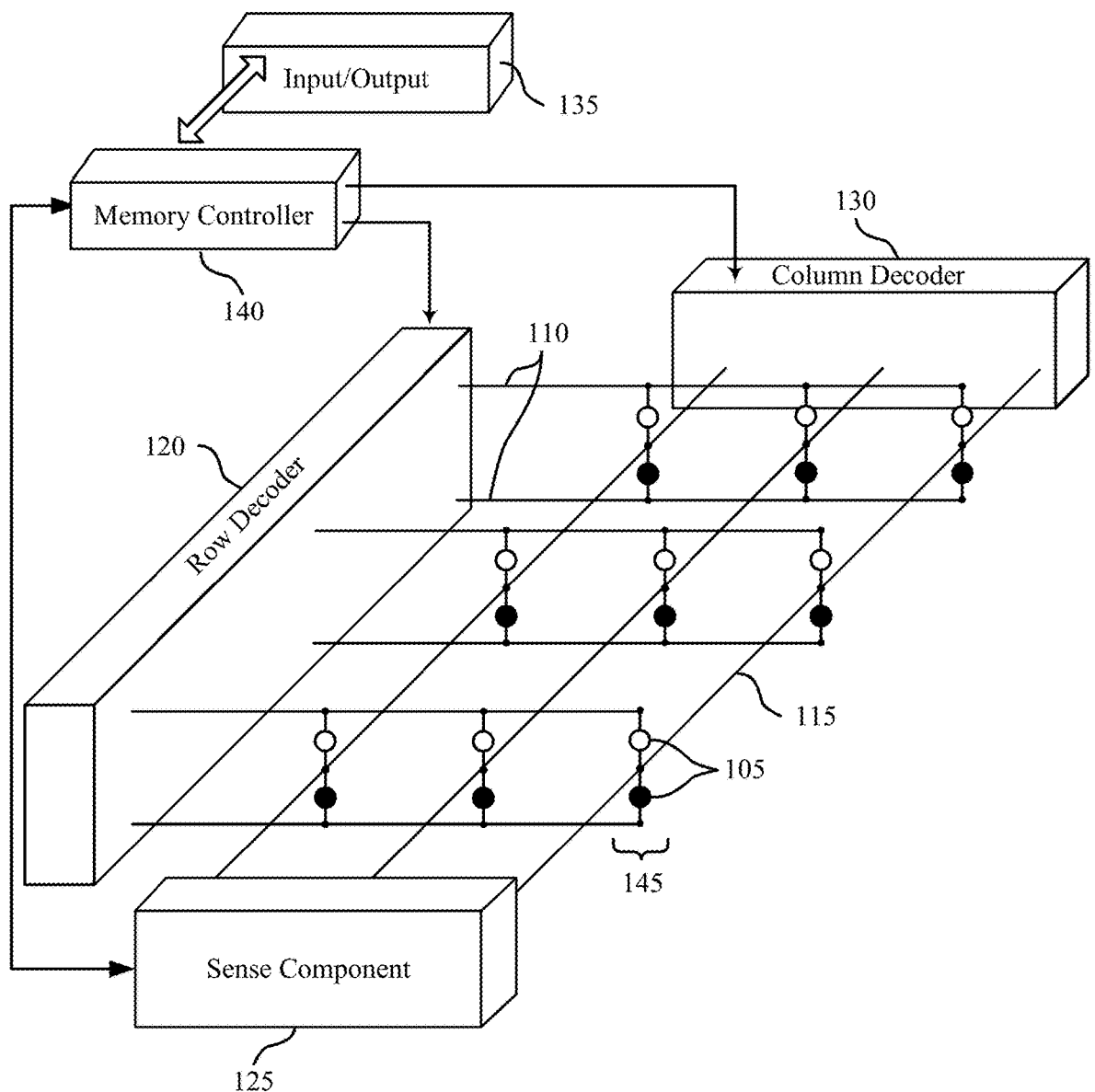
FIG. 1 illustrates an example memory array that may be formed using dopant-modulated etching in accordance with examples of the present disclosure.

An SSM cell with an asymmetric geometry such as a tapered or stepped profile may affect a distribution of ions in a memory cell. As the distribution of ions in the memory cell changes, it may affect a threshold voltage of the memory cell and may be used to store different programmed states. For example, applying a particular programming pulse may cause ions to crowd at or near a particular electrode of a cell. The geometry of the memory cell may enhance the sense window for the cell, which may result in more accurate sensing as compared to cells with a symmetric profile.

Techniques for fabricating SSM cells having asymmetric profiles are described herein. Each memory cell may have a memory storage element that stores the logic state of the cell based at least in part on a distribution of ions in the memory storage element. For SSM cells, the memory storage element may be a chalcogenide material. When the cell is formed, the memory storage element may be doped with a dopant that affects a subsequent etching rate of the memory storage element. By varying the doping concentration within the memory storage element and then etching the memory cell, it is possible to control the resulting geometry of the memory storage element. In some cases, the dopant is used to control the etching rate rather than to affect the conductivity of the cell. Doping the memory storage element with a non-uniform doping concentration may result in an asymmetric geometry of the memory storage element after etching. For example, doping the memory storage element with a doping gradient between the top surface and bottom surface of the memory storage element may result in a corresponding tapered profile of the memory storage element after etching, in which one surface of the memory storage element has a larger area than the other surface. This may have the effect of crowding ions at or near one of the two electrodes, thereby enhancing the sense window for the cell.

For multi-deck SSM memory devices, the goal of fabricating memory cells with asymmetric memory storage elements may be complicated by the additional design goal of sharing access lines (e.g., word lines and/or digit lines) between memory cells that are stacked on top of each other in adjacent decks. This may require fabricating a device with memory cells on different decks having different geometries in order to obtain the benefits associated with shared access lines and asymmetric memory cell geometries. Techniques described herein may use dopant-modulated etching to achieve these goals.

Features of the disclosure introduced above are further described below in the context of a memory array. SSM cells with tapered or stepped profiles are illustrated and depicted in the context of a cross-point architecture. These and other features of the disclosure are further illustrated by and described with reference to apparatus diagrams, system diagrams, and flowcharts that relate to dopant-modulated etching for memory devices, such as self-selecting memory devices.

For the purpose of this discussion, the terms "asymmetric memory cell" and "asymmetric memory storage element" may be used interchangeably. For example, a memory cell having an asymmetric memory storage element (such as a memory storage element with a tapered profile or stepped profile) may be referred to as an asymmetric memory cell. In addition, an asymmetric memory storage element may only be asymmetric along one axis; it may be symmetric along another axis, such as in the case of a trapezoidal or barrel-like shape.

FIG. 1 illustrates an example memory array that may be formed using dopant-modulated etching in accordance with examples of the present disclosure. Memory array 100 may also be referred to as an electronic memory apparatus. Memory array 100 includes memory cells 105 that are programmable to store different states. Each memory cell 105 may be programmable to store two states, denoted a logic "0" and a logic "1." In some cases, memory cell 105 is configured to store more than two logic states.

A memory cell 105 may include a chalcogenide material, which may be referred to as a chalcogenide material memory component or memory storage element, that has a variable and configurable threshold voltage or electrical resistance, or both, that is representative of the logic states. In some examples, a threshold voltage of a cell changes depending on a polarity used to program the cell. For example, an SSM cell programmed with one polarity may have certain resistive properties and thus one threshold voltage. And that SSM cell may be programmed with a different polarity that may result in different resistive properties of the cell and thus a different threshold voltage. As discussed above, when an SSM cell is programmed, elements within the cell may separate, causing ion migration. Ions may migrate towards a particular electrode, depending on the given cell's polarity. For example, in an SSM cell, ions may migrate towards the negative electrode. The memory cell may then be read by applying a voltage across the cell to sense which electrode ions have migrated towards. In some examples, cations may migrate towards one of the electrodes while anions may migrate towards the other of the electrodes.

In some examples, cell programming may exploit the crystalline structure or atomic configuration to achieve different logic states. For example, a material with a crystalline or an amorphous atomic configuration may have different electrical resistances. A crystalline state may have a low electrical resistance and may, in some cases, be referred to as the "set" state. An amorphous state may have a high electrical resistance and may be referred to as the "reset" state. A voltage applied to the memory cell 105 may thus result in different currents depending on whether the material is in a crystalline or an amorphous state, and the magnitude of the resulting current may be used to determine the logic state stored by memory cell 105.

In some cases, a material in the amorphous, or reset, state may have a threshold voltage associated with it—that is, current flows after the threshold voltage is exceed. Thus, if the applied voltage is less than the threshold voltage, no current may flow if the memory element is in the reset state; if the memory element is in the set state, it may not have a threshold voltage (i.e., a threshold voltage of zero) and, thus, a current may flow in response to the applied voltage. In other cases, the memory cell 105 may have a combination of crystalline and amorphous areas that may result in intermediate resistances, which may correspond to different logic states (i.e., states other than logic 1 or logic 0) and may allow memory cells 105 to store more than two different logic states. As discussed below, the logic state of a memory cell 105 may be set by heating, including melting, the memory element.

Memory array 100 may be a three-dimensional (3D) memory array, where two-dimensional (2D) memory arrays are formed on top of one another. This may increase the number of memory cells that may formed on a single die or substrate as compared with 2D arrays, which in turn may reduce production costs or increase the performance of the memory array, or both. According to the example depicted in FIG. 1, memory array 100 includes two levels (e.g., decks) of memory cells 105 and may thus be considered a three-dimensional memory array; however, the number of decks is not limited to two. Each deck may be aligned or positioned so that memory cells 105 may be approximately aligned with one another across each deck, forming a memory cell stack 145.

Each row of memory cells 105 is connected to an access line 110 and an access line 115. Access lines 110 may also be known as word lines 110 and digit lines 115, respectively. Digit lines 115 may also be known bit lines 115. References to word lines and digit lines, or their analogues, are interchangeable without loss of understanding or operation. Word lines 110 and digit lines 115 may be substantially perpendicular to one another to create an array. The two memory cells 105 in a memory cell stack 145 may share a common conductive line such as a digit line 115. That is, a digit line 115 may be in electronic communication with the bottom electrode of the upper memory cell 105 and the top electrode of the lower memory cell 105. Memory cell 105 may be asymmetrically shaped (e.g., memory cell 105 may have an asymmetrically shaped memory storage element).

In general, one memory cell 105 may be located at the intersection of two conductive lines such as a word line 110 and a digit line 115. This intersection may be referred to as a memory cell's address. A target memory cell 105 may be a memory cell 105 located at the intersection of an energized word line 110 and digit line 115; that is, a word line 110 and digit line 115 may be energized in order to read or write a memory cell 105 at their intersection. Other memory cells 105 that are in electronic communication with (e.g., connected to) the same word line 110 or digit line 115 may be referred to as untargeted memory cells 105.

As discussed above, electrodes may be coupled to a memory cell 105 and a word line 110 or a digit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory array 100.

Operations such as reading and writing may be performed on memory cells 105 by activating or selecting a word line 110 and digit line 115, which may include applying a voltage or a current to the respective line. Word lines 110 and digit lines 115 may be made of conductive materials, such as metals (e.g., copper (Cu), aluminum (Al), gold (Au), tungsten (W), titanium (Ti), etc.), metal alloys, carbon, conductively-doped semiconductors, or other conductive materials, alloys, or compounds. Upon selecting a memory cell 105, a migration of, for example, selenium (Se) ions may be leveraged to set a logic state of the cell. Additionally or alternatively, ions of other conductive materials may migrate in addition to or in replace of selenium (Se) ions.

For example, a memory cell may be programmed by applying an electric pulse to the cell, which may include a memory storage element that includes selenium. The pulse may be provided via a first access line (e.g., word line 110) or a second access line (e.g., digit line 115), for example. Upon providing the pulse, selenium ions may migrate within the memory storage element, depending on the polarity of the memory cell. Thus, a concentration of selenium relative to the first side or the second side of the memory storage element is based at least in part on a polarity of a voltage between the first access line and the second access line.

For memory cells having a tapered profile or stepped profile, such as those described herein, selenium ions may be more crowded at portions of a memory storage element having more area. Selenium-rich portions of the memory storage element may have a higher resistivity and thus may give rise to a higher threshold voltage) than those portions of the element having relatively less selenium. As compared with symmetrically shaped (e.g., rectangular, untapered and un-stepped) memory cells, the relative resistance between different portions of the memory storage element may be enhanced.

The memory cell may then be read by applying a voltage across the cell to sense which electrode ions have migrated towards. Increased sensing reliability in a SSM device may be realized with an asymmetrical geometry that enhances ion crowding at or near a particular electrode. Each memory cell may be configured such that, when programmed, ions within the cell migrate towards one electrode. Due to an asymmetrical geometry of the memory cell (such as a tapered profile), a greater density of ions may build up at or near an electrode. This may create a region with a high density of ions and a region with a low density of ions within the cell. Depending on the polarity of the memory cell, this concentration of migrating ions may represent a logic "1" or logic "0" state.

The memory cell may be sensed by applying a voltage across the cell. The resulting current may first encounter the high resistivity region, followed by a band gap, and then the low resistivity region within the cell. This may affect the threshold voltage of the cell because when the cell is activated, current flowing through the cell may encounter both regions. The orientation of the region may be representative of a first or a second logic state of the cell. For example, a high resistivity region at or near a first electrode may be representative of a logic "1" state and a low resistivity region) at or near the first electrode may be representative of a logic "0" state. For example, the orientation of the high resistivity and low resistivity regions may affect the threshold voltage of the cell and thus the logic state of the cell. Such an asymmetrical geometry allows for the memory cell to be sensed more accurately.

In some examples, a memory cell with an asymmetrical geometry may be formed by doping the chalcogenide material with a dopant that affects a subsequent etching rate of the chalcogenide material, and then etching the memory cell. The chalcogenide material may be non-uniformly doped so that, after etching, it has an asymmetric geometry, such as a tapered or stepped profile. In some cases, the doping concentration or doping gradient may be determined based on the desired taper profile; that is, if a particular memory cell geometry is desired, a corresponding non-uniform doping concentration can be determined such that the memory cell will have the desired asymmetric geometry after etching.

To read the cell, a voltage may be applied across memory cell 105 and the resulting current or the threshold voltage at which current begins to flow may be representative of a logic "1" or a logic "0" state. The crowding of selenium ions at one or the other ends of a memory storage element may affect the resistivity and/or the threshold voltage, resulting in greater distinctions in cell response between logic states.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate digit line 115. Thus, by activating a word line 110 and a digit line 115, a memory cell 105 may be accessed.

Upon accessing, a memory cell 105 may be read, or sensed, by sense component 125. For example, sense component 125 may be configured to determine the stored logic state of memory cell 105 based on a signal generated by accessing memory cell 105. The signal may include a voltage or electrical current, and sense component 125 may include voltage sense amplifiers, current sense amplifiers, or both. For example, a voltage may be applied to a memory cell 105 (using the corresponding word line 110 and digit line 115) and the magnitude of the resulting current may depend on the electrical resistance of the memory cell 105. Likewise, a current may be applied to a memory cell 105 and the magnitude of the voltage to create the current may depend on the electrical resistance of the memory cell 105. Sense component 125 may include various transistors or amplifiers in order to detect and amplify a signal, which may be referred to as latching. The detected logic state of memory cell 105 may then be output as output 135. In some cases, sense component 125 may be a part of column decoder 130 or row decoder 120. Or, sense component 125 may be connected to or in electronic communication with column decoder 130 or row decoder 120.

A memory cell 105 may be programmed, or written, by similarly activating the relevant word line 110 and digit line 115—i.e., a logic value may be stored in the memory cell 105. Column decoder 130 or row decoder 120 may accept data, for example input/output 135, to be written to the memory cells 105. In the case of phase change memory or SSM, a memory cell 105 may be written by heating the memory storage element, for example, by passing a current through the memory storage element. Depending on the logic state written to memory cell 105—e.g., logic "1" or logic "0"—selenium ions may crowd at or near a particular electrode. For example, dependent on the polarity of memory cell 105, ion crowding at or near a first electrode may result in a first threshold voltage representative of a logic "1" state and ion crowding at or near a second electrode may result in a second threshold voltage, different from the first, representative of a logic "0" state. The first threshold voltage and second threshold voltage may, for example, be determined during a read operation performed in a predetermined polarity. The difference between the first and second threshold voltages may be more pronounced in a memory storage element that is asymmetric, including those described with reference to FIG. 3.

In some memory architectures, accessing the memory cell 105 may degrade or destroy the stored logic state and re-write or refresh operations may be performed to return the original logic state to memory cell 105. In DRAM, for example, the logic-storing capacitor may be partially or completely discharged during a sense operation, corrupting the stored logic state. So the logic state may be re-written after a sense operation. Additionally, activating a single word line 110 may result in the discharge of all memory cells in the row; thus, all memory cells 105 in the row may need to be re-written. But in non-volatile memory, such as PCM and/or SSM, accessing the memory cell 105 may not destroy the logic state and, thus, the memory cell 105 may not require re-writing after accessing.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, non-volatile PCM and/or SSM cells may have beneficial properties that may result in improved performance relative to other memory architectures. For example, PCM and/or SSM may offer comparable read/write speeds as DRAM but may be non-volatile and allow for increased cell density.

The memory controller 140 may control the operation (read, write, re-write, refresh, discharge, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory array 100. For example, it may apply discharge voltages to a word line 110 or digit line 115 after accessing one or more memory cells 105.

Figure 2:
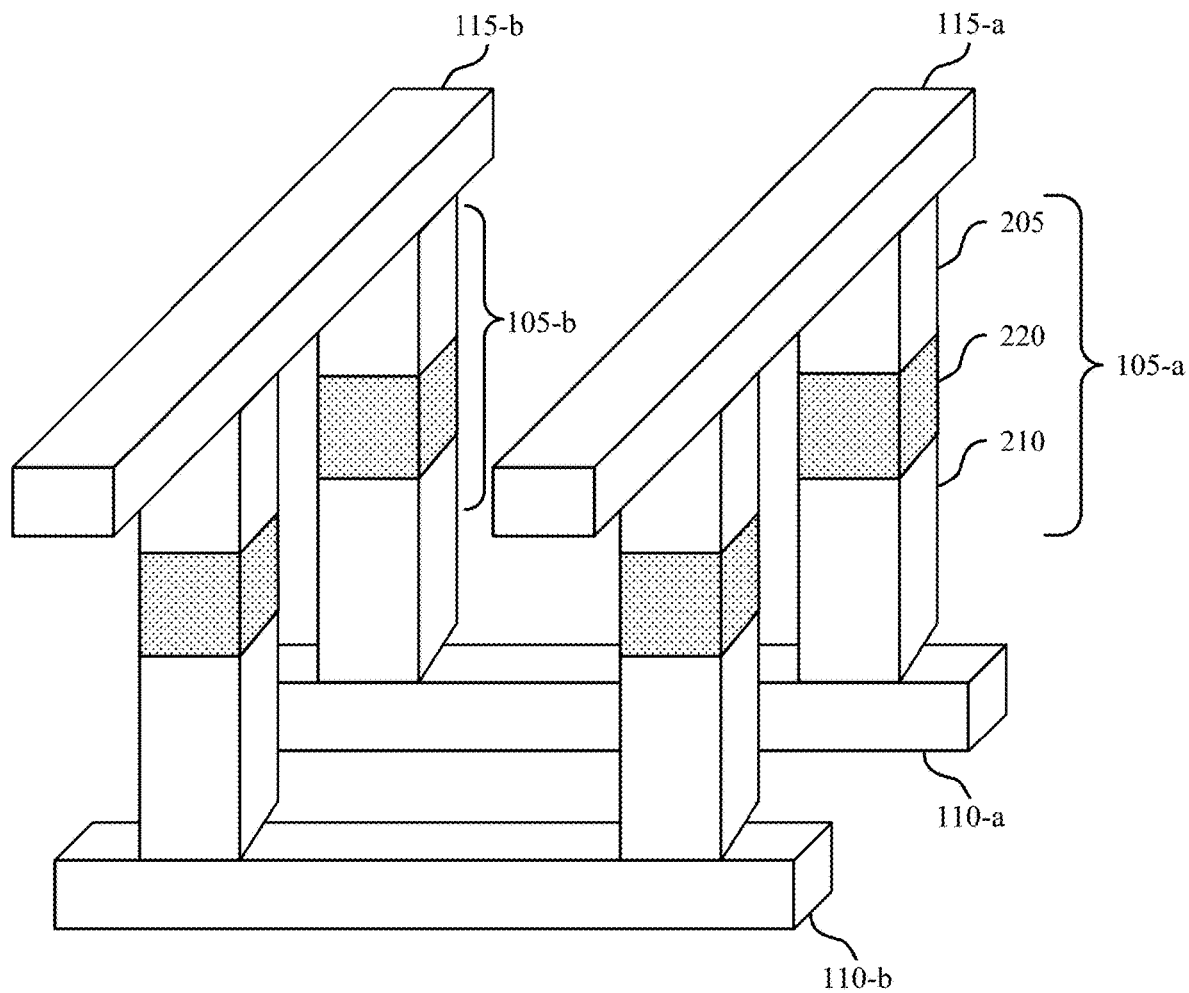
FIG. 2 illustrates an example memory array that may be formed using dopant-modulated etching in accordance with examples of the present disclosure.

FIG. 2 illustrates an example memory array 200 that may be formed using dopant-modulated etching in accordance with examples of the present disclosure. Memory array 200 may be an example of memory array 100 with reference to FIG. 1.

Memory array 200 may include memory cells 105-a, 105-b, word lines 110-a, 110-b, and digit lines 115-a, 115-b which may be examples of a memory cell 105, word line 110, and digit line 115, as described with reference to FIG. 1. Memory cell 105-a may include electrode 205 (e.g., top electrode), electrode 210 (e.g., a bottom electrode), and memory storage element 220, which may include a chalcogenide storage material and may contain or may be an SSM component. The logic state of memory cell 105-a may be based on at least one characteristic of memory storage element 220. Memory cell 105-b may include a top electrode, bottom electrode, and memory storage element similar to memory cell 105-a. Electrode 205 may be referred to as a top electrode and electrode 210 may be referred to as a bottom electrode. In some cases, a 3D memory array may be formed by stacking multiple memory arrays 200 on one another. The two stacked arrays may, in some examples, have common conductive lines so each deck may share word lines 110-a, 110-b or digit lines 115-a, 115-b. Memory cell 105-a may depict a target memory cell—i.e., a target of a sensing operation, as described elsewhere herein.

The architecture of memory array 200 may be referred to as a cross-point architecture. It may also be referred to as a pillar structure. For example, as shown in FIG. 2, a pillar may be in contact with a first conductive line (e.g., an access line such as word line 110-a) and a second conductive line (e.g., an access line such as digit line 115-a). The pillar may comprise memory cell 105-a, where memory cell 105-a includes a first electrode (e.g., top electrode 205), memory storage element 220, and a second electrode (e.g., bottom electrode 210). Memory storage element 220 (and therefore, memory cell 105-a) may have an asymmetric geometry, such as a tapered or stepped profile as described with respect to FIGS. 4 and 7, respectively. A tapered or stepped profile may cause ion crowding at the top electrode 205 or bottom electrode 210, depending on the polarity of memory cell 105-a. Ion crowding at top electrode 205 or bottom electrode 210 may allow for more-accurate sensing of memory cell 105-a, as described above.

The cross-point or pillar architecture depicted in FIG. 2 may offer relatively high-density data storage with lower production costs compared to other memory architectures. For example, the cross-point architecture may have memory cells with a reduced area and thus an increased memory cell density compared to other architectures. For example, the architecture may have a $4F^2$ memory cell area, where F is the smallest feature size, compared to other architectures with a $6F^2$ memory cell area, such as those with a three-terminal selection. For example, DRAM may use a transistor, which is a three-terminal device, as the selection component for each memory cell and may have a larger memory cell area compared to the pillar architecture.

In some examples, memory array 200 may be operated using a positive voltage source and the magnitude of an intermediary voltage is between the magnitude of the positive voltage source and a virtual ground. In some examples, both digit line access voltage and word line access voltage are maintained at an intermediary voltage prior to an access operation of memory cell 105-a. And during an access operation, digit line access voltage may be increased (e.g., to a positive supply rail) while word line access voltage may be simultaneously decreased (e.g., to a virtual ground), generating a net voltage across memory cell 105-a. The threshold voltage at which current begins to flow through cell 105-a as a result of applying a voltage across cell 105-a may be a function of ion migration towards top electrode 205 or bottom electrode 210, which in turn may vary with the shape of memory storage element 220.

Memory storage element 220 may, in some cases, be connected in series between a first conductive line and a second conductive line, for example, between word line 110-a and digit line 115-a. For example, as depicted in FIG.

2, memory storage element 220 may be located between top electrode 205 and bottom electrode 210; thus, memory storage element 220 may be located in series between digit line 115-*a* and word line 110-*a*. Other configurations are possible. As mentioned above, memory storage element 220 may have a threshold voltage such that a current flows through memory storage element 220 when the threshold voltage is met or exceeded. The threshold voltage may depend on the programming of cell 105-*a* and the shape of memory storage element 220.

Memory storage element 220 may be configured in an asymmetrical shape to facilitate ion crowding at or near top electrode 205 or bottom electrode 210. For example, memory storage element 220 may be in the shape of a trapezoidal prism and a cross-section of memory storage element 220 may include a trapezoid. Alternatively, memory storage element 220 may be a frustum. A frustum, as used herein, includes a shape of or resembling the portion of a cone or pyramid with the upper portion removed, or a shape of or resembling the portion of a cone or pyramid between a first plane that intercepts the cone or pyramid below the top and a second plane at or above the base. Memory storage element 220 may be arranged in a series configuration between the first access line 110-*a* and second access line 115-*a*. Memory storage element 220 may include a first chalcogenide glass material comprising selenium. In some examples, memory storage element 220 comprises a composition of at least one of selenium, arsenic (As), tellurium (Te), silicon (Si), germanium (Ge), or antimony (Sb). When a programming voltage is applied across the memory storage element 220 (or when there is a voltage difference between top electrode 205 and bottom electrode 210, ions may migrate toward one or the other electrode. For example, Te and Se ions may migrate towards a positive electrode and Ge and As ions may migrate toward a negative electrode. Memory storage element 220 may also serve as a selector device. This type of memory architecture may be referred to as SSM.

To achieve an asymmetrical shape, in some examples, memory storage element 220 may be non-uniformly doped with a dopant that will affect the etching rate of a subsequent etching process of memory storage element 220. The dopant may be indium, for example. The maximum doping concentration of the dopant may be selected to be low enough that the dopant does not substantially affect the conductivity of the memory cell (such as the migration of Te, Se, Ge, or As ions, or other electrical properties). Depending on the dopant, the doping concentration may be in the range of 0.5% to 15%, for example.

In some examples, the non-uniform concentration of the dopant may continue to be present in the memory cell after fabrication and during normal operation. In other examples, the non-uniform concentration of the dopant may change after fabrication due to, for example, application of one or more electrical pulses to the memory cell that alters the doping concentration of the memory cell. Such electrical pulses may be applied during a subsequent manufacturing process, during a packaging process, and/or during a memory cell access operation such as a read or write operation, for example. In this case, the concentration of the dopant may be changed to a different non-uniform doping concentration, or to a substantially uniform doping concentration.

Memory array 200 may be made by various combinations of material formation and removal. For example, layers of material may be deposited that correspond to word line 110-*a*, bottom electrode 210, memory storage element 220, and top electrode 205. Material may be selectively removed to then create the desired features, such as the structure depicted in FIGS. 4A and 7. For example, features may be defined using photolithography to pattern a photoresist and then material may be removed by techniques such as etching. Digit line 115-*a* may then be formed, for example, by depositing a layer of material and selectively etching to form a line structure. In some cases, electrically insulating regions or layers may be formed or deposited. The electrically insulating regions may include oxide or nitride materials, such as silicon oxide, silicon nitride, or other electrically insulating materials.

Various techniques may be used to form materials or components of memory array 200. These may include, for example, chemical vapor deposition (CVD), metal-organic chemical vapor deposition (MOCVD), physical vapor deposition (PVD), sputter deposition, atomic layer deposition (ALD), or molecular beam epitaxy (MBE), among other thin film growth techniques. Material may be removed using a number of techniques, which may include, for example, chemical etching (also referred to as "wet etching"), plasma etching (also referred to as "dry etching"), or chemical-mechanical planarization.

Figure 3:
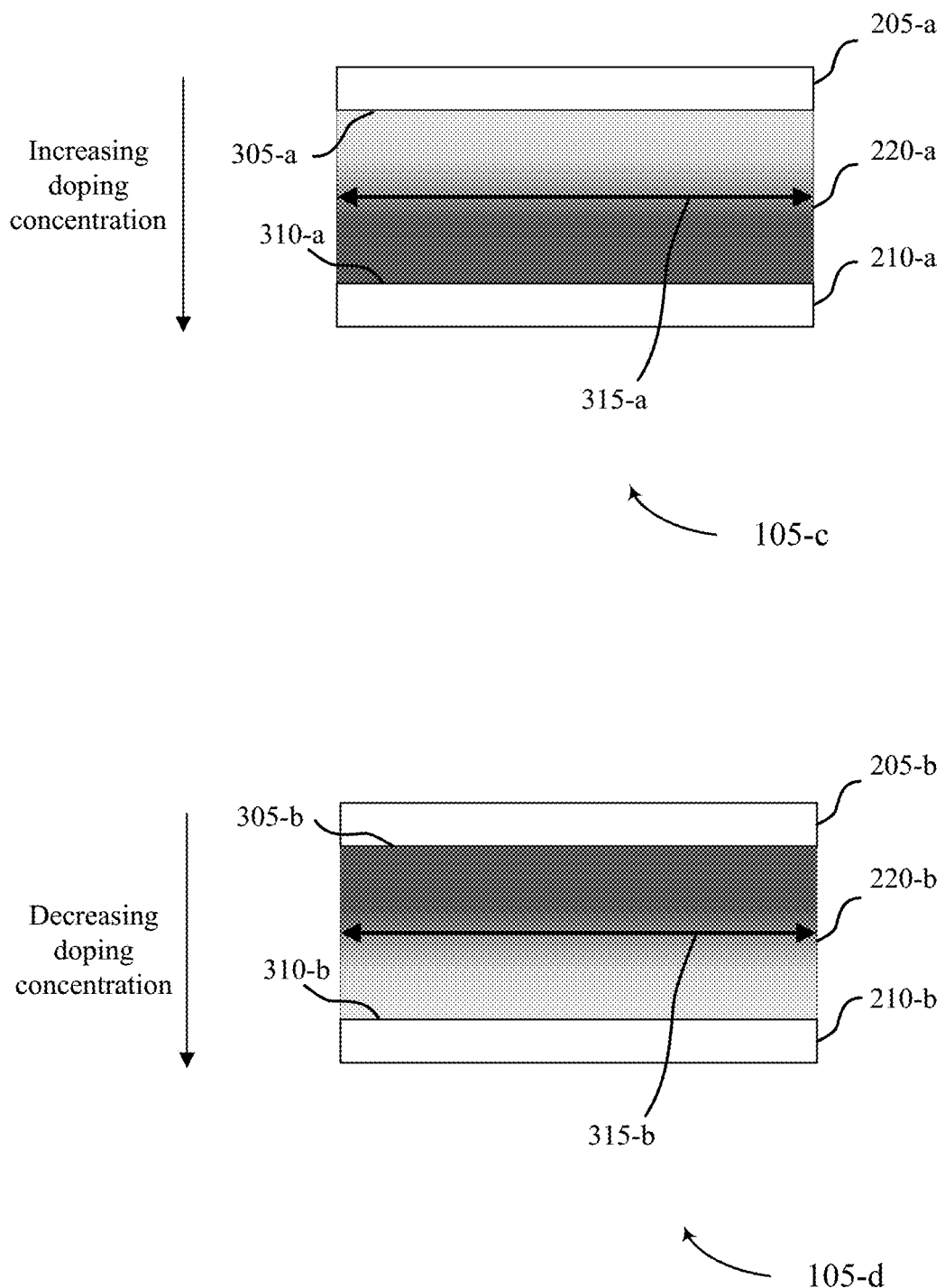
FIG. 3 illustrates example memory cells that may be formed using dopant-modulated etching in accordance with examples of the present disclosure.

FIG. 3 illustrates example memory cells 105-*c*, 105-*d* that may be formed using dopant-modulated etching in accordance with examples of the present disclosure. Memory cells 105-*c* and 105-*d* have memory storage elements 220-*a*, 220-*b* that may be doped to enable dopant-modulated etching. FIG. 3 may depict memory cells 105-*c*, 105-*d* after doping but prior to etching, for example. Memory storage elements 220-*a*, 200-*b* may include a chalcogenide material.

Memory cell 105-*c*, for example, illustrates memory storage element 220-*a* coupled to top electrode 205-*a* and bottom electrode 210-*a*. Memory cell 105-*d* illustrates similar features, with memory storage element 220-*b* coupled to top electrode 205-*b* and bottom electrode 210-*b*. In some examples, top electrode 205-*a*, 205-*b* may be referred to as a bottom electrode and bottom electrode 210-*a*, 210-*b* may be referred to as a top electrode.

Memory cells 105-*c* and 105-*d* may depict the geometry of memory storage elements 220-*a*, 220-*b* prior to etching; in this example, the geometry may be a rectangular prism. Memory cells 105-*c* and 105-*d* may be a cross-section of a line of memory storage elements 220-*a*, 220-*b*. In such cases, the geometry of the memory cells 105-*c* and 105-*d* may be a geometry of a cross-section of a line of material.

Each memory storage element 220-*a*, 220-*b* may include a top surface 305-*a*, 305-*b*, a bottom surface 310-*a*, 310-*b*, and a width 315-*a*, 315-*b* in a first direction that is substantially perpendicular to a second direction between first surface 305-*a*, 305-*b* and second surface 310-*a*, 310-*b*. In the example of FIG. 3, the width 315-*a* of memory storage element 220-*a* before etching is uniform along the second direction. Top surface 305-*a*, 305-*b* may be coupled to top electrode 205-*a*, 205-*b* and bottom surface 310-*a*, 310-*b* may be coupled to bottom electrode 210-*a*, 210-*b*. Top electrode 205-*a* of memory cell 105-*c* may be coupled to a digit line 115, for example. Bottom electrode 210-*a* of memory cell 105-*c* may be coupled to a word line 110, for example. In other examples, the reverse may be true; e.g., top electrode 205-*a* may be coupled to a word line 110 and bottom electrode 210-*a* may be coupled to a digit line 115. Memory cell 105-*d* may be similarly coupled to a word line and digit line.

Memory storage element 220-*a*, 220-*b* may be doped with a dopant that will affect an etching rate of memory storage element 220-*a*, 220-*b* when it is subsequently etched. In some examples, a memory storage element 220 may be doped with a non-uniform doping concentration; e.g., a doping concentration that is non-uniform within memory storage element 220.

In FIG. 3, a non-uniform doping concentration of memory storage element 220-a, 220-b is indicated by a grayscale gradient, with a darker gray color indicating a higher concentration of the dopant in the memory storage element material. Memory storage element 220-a is doped with a doping gradient such that the doping concentration increases in the direction from top surface 305-a to bottom surface 310-b, while the doping concentration of memory storage element 220-b decreases in the direction from top surface 305-b to bottom surface 310-b. In both examples, the doping concentration in memory storage element 220-a, 220-b is non-uniform in a direction that is roughly perpendicular to top surface 305-a, 305-b and bottom surface 310-a, 310-b.

Figure 5:
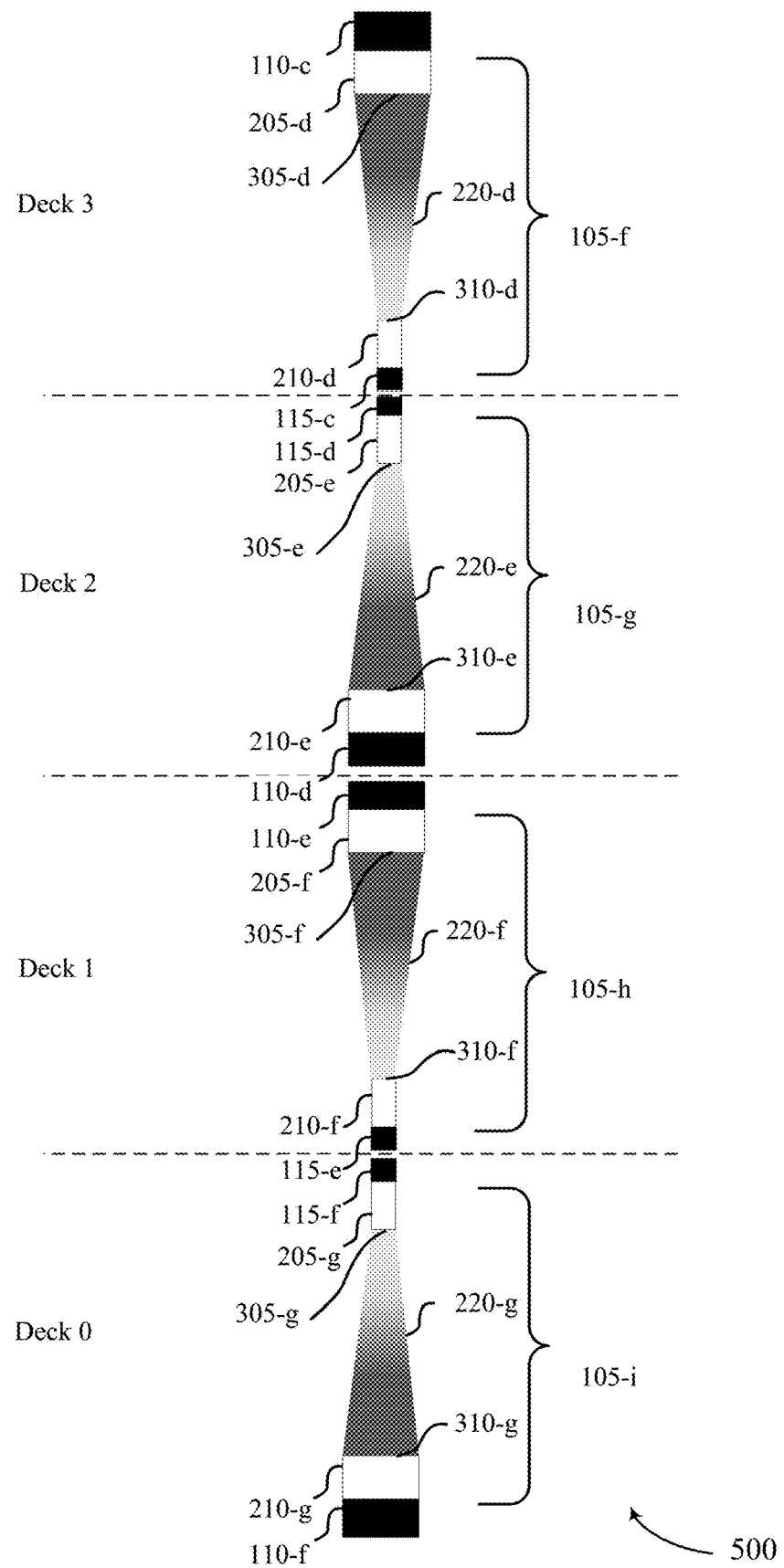
FIG. 5 illustrates an example multi-deck memory device that may be formed using dopant-modulated etching in accordance with examples of the present disclosure.
Figure 6:
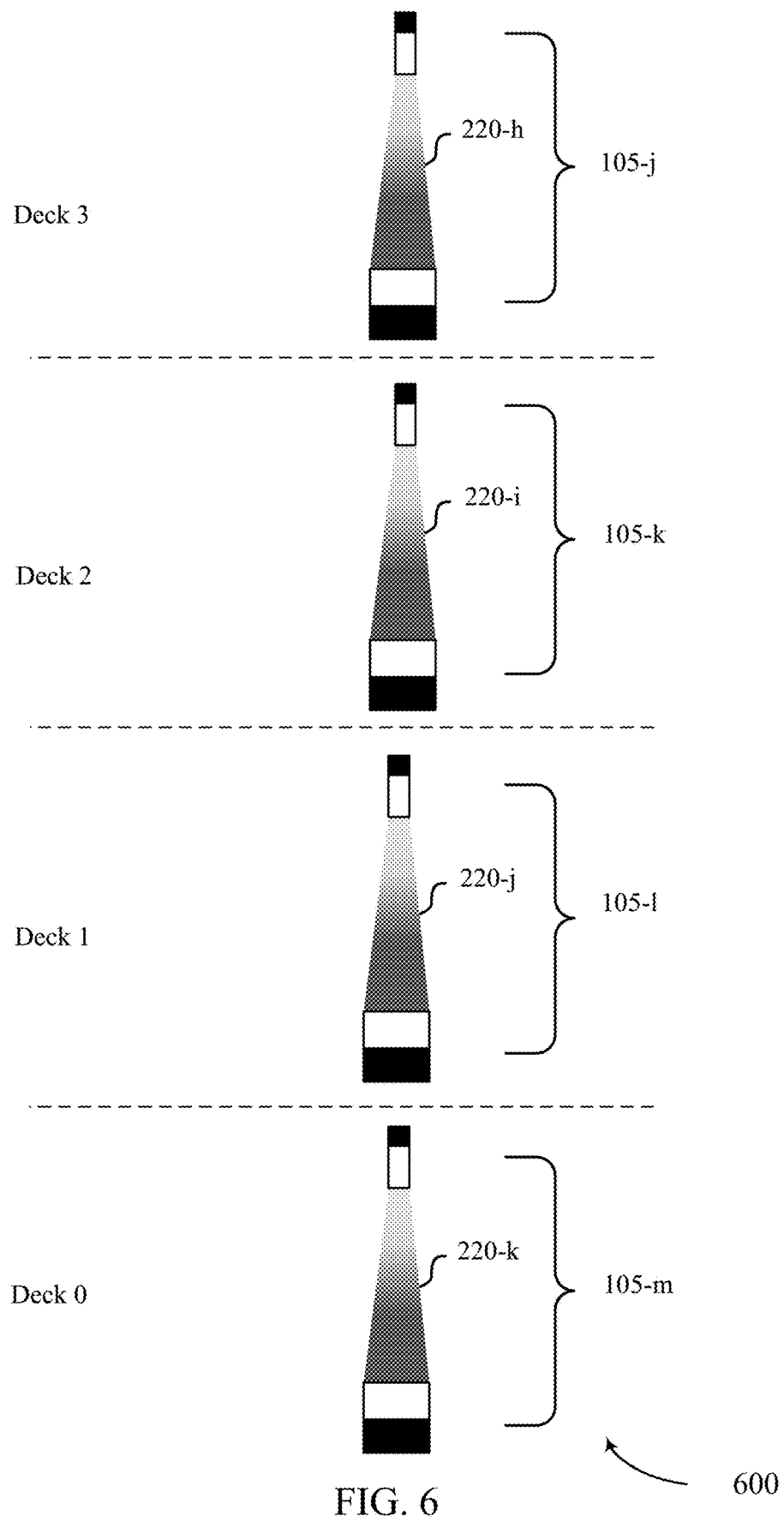
FIG. 6 illustrates an example multi-deck memory device that may be formed using dopant-modulated etching in accordance with examples of the present disclosure.
Figure 7:
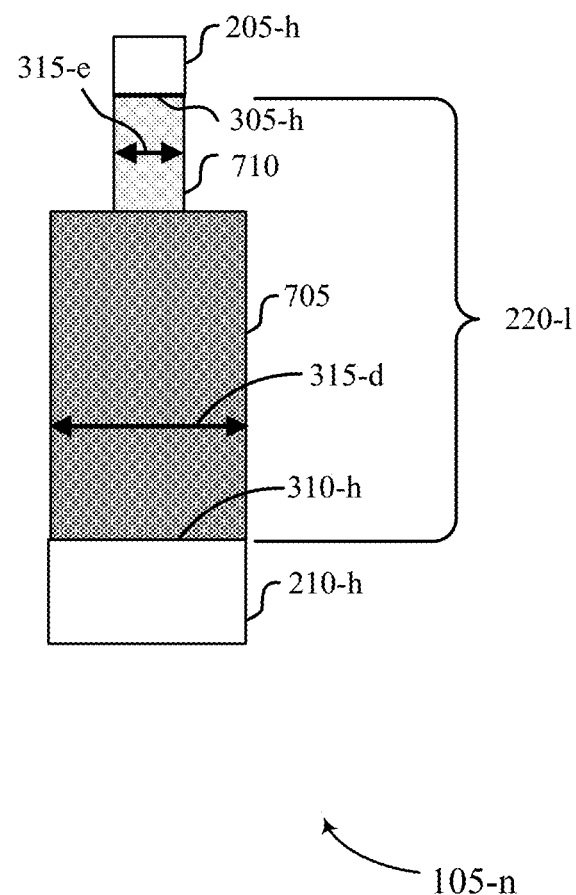
FIG. 7 illustrates an example memory cell that may be formed using dopant-modulated etching in accordance with examples of the present disclosure.

In some examples, memory storage element 220 may be doped with a non-uniform doping concentration in order to modulate the etching rate of different portions or at different locations on a memory storage element. By varying the etching rate of the memory storage element, a memory storage element or memory cell with a tapered profile (e.g., as depicted in FIGS. 4-6) or stepped profile (e.g., as depicted in FIG. 7) may be formed.

In some examples, a doping concentration may increase from the surface of the memory storage element coupled to a digit line to the surface area of the memory storage element coupled to a word line; that is, the doping concentration of the memory storage element may be higher close to the word line than close to the digit line. In some examples, this non-uniform doping concentration modulates the etching process so that, after etching, the area of the surface of the memory storage element that is coupled to a word line 110 (e.g., through electrode 210-a) is larger than the area of the surface of the memory storage element that is coupled to a digit line 115 (e.g., through electrode 205-a). This difference in surface areas may improve the memory cell operation by causing ion crowding closer to the digit line, as previously discussed.

In other examples, the reverse may be true. For example, the doping concentration of a memory storage element may increase from the word line to the digit line, such that, after etching, the area of the surface of the memory storage element that is coupled to a digit line 115 (e.g., through electrode 205-b) is larger than the area of the surface of the memory storage element that is coupled to a word line 110 (e.g., through electrode 210-b). This difference in surface areas may cause ion crowding closer to the word line.

In some examples, the dopant is indium, which may decrease the etching rate of certain etching processes such that it takes more time to remove a given amount of material than if the material were either un-doped with indium or doped with indium at a lower concentration.

In some examples, the dopant may be a different dopant than indium. The examples depicted herein assume that a higher concentration of the dopant results in a slower (lower) etch rate. However, the reverse characteristic may be true for other dopants or for other etching processes.

In some examples, the dopant and/or the doping concentration of the memory storage element 220-a, 220-b may be selected such that the dopant does not substantially affect the conductivity of the memory cell 105-c, 105-d, such as the ion migration in the memory storage element. For example, the dopant may be indium, which may not substantially affect ion migration in the memory cell at doping concentrations that are below, for example, 15%. For example, the doping concentration may increase from approximately 1% at the first surface to 10% at the second surface. For other dopants, a different range may be appropriate.

In some examples, memory storage element 220 may be non-uniformly doped using a co-sputter process. A co-sputter process may allow relatively precise control of a doping gradient in memory storage element 220 by using two different targets (at least one of which includes the selected dopant, such as indium) to deposit material on or within the memory storage element. In some examples, memory storage element 200 may be non-uniformly doped using an implant process such as a low energy implant and/or implants at different energies.

Figure 4A:
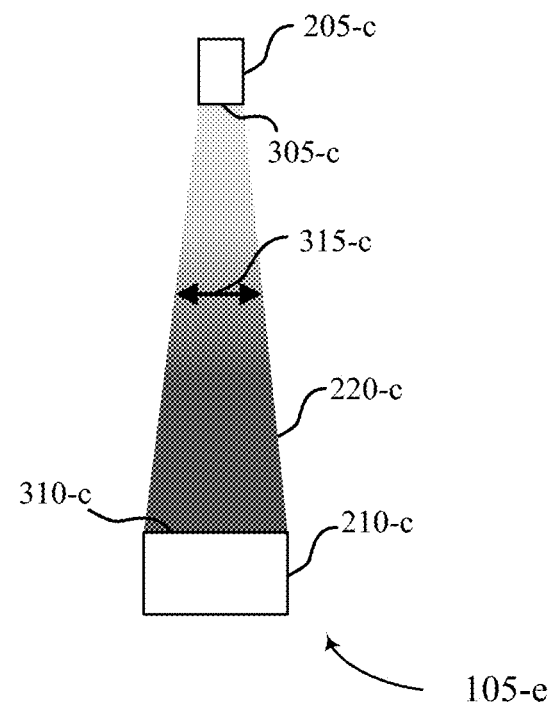
FIGS. 4A-4B illustrate an example memory cell that may be formed using dopant-modulated etching in accordance with examples of the present disclosure.
Figure 4B:
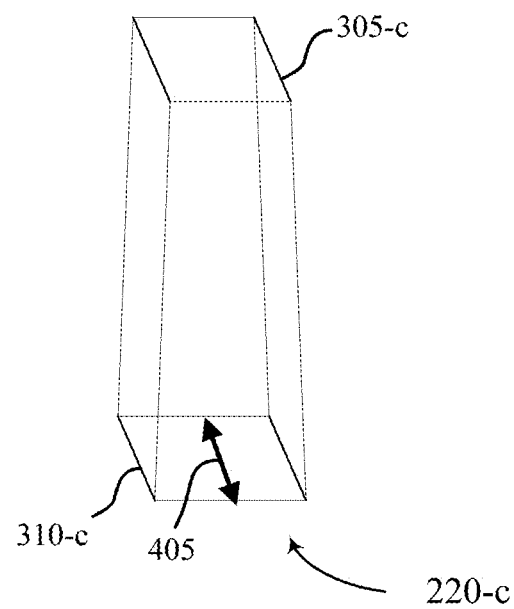

FIGS. 4A-4B illustrate an example memory cell 105-e that may be formed using dopant-modulated etching in accordance with examples of the present disclosure. Memory cell 105-e may correspond to memory cell 105-c after it has been etched with one or more etching steps. The non-uniform doping concentration of memory storage element 220-a depicted in FIG. 3 may cause a corresponding variation of the width 315-c of memory storage element 220-c along a direction between top surface 305-c and bottom surface 310-c of memory storage element 220-c after etching, thus resulting in the asymmetrical geometry of memory storage element 220-c depicted in FIGS. 4A-4B.

Memory storage element 220-c has a taper profile. In the exemplary taper profile depicted in FIGS. 4A-4B, memory storage element 220-c tapers (e.g., narrows) from bottom surface 310-c to top surface 305-c. In other examples, a memory storage element 220 may have a taper profile that tapers from a top surface 305 to a bottom surface 310. For example, the taper profile may be a reflection of the taper profile depicted in FIG. 4A. Other arbitrary geometries are also possible, including non-smooth or discontinuous profiles (e.g., the stepped profile described with reference to FIG. 7).

As depicted in FIG. 4A, the width 315-c of memory storage element 220-c varies along the direction from top surface 305-c to bottom surface 310-c; in this example, the width 315-c is narrower at the top surface 305-c than at the bottom surface 310-c. In some examples, as depicted in FIG. 4B, a depth 405 of memory storage element 220-c may also vary along the direction from the top surface to the bottom surface. In other examples, the depth of a memory storage element 220 may be constant along the direction from the top surface to the bottom surface.

In some examples, a memory storage element 220 after etching is in the shape of a trapezoidal prism, such as in memory storage element 220-c, and has a cross-sectional area that varies in size along the direction from the top surface to the bottom surface.

In the example of FIGS. 4A-4B, the area of top surface 305-c of memory storage element 220-c is smaller than the area of bottom surface 310-c of memory storage element 220-c. As previously discussed, it may be desirable to have a larger surface area of a memory storage element coupled to one access line (e.g., a word line) than the area of the surface of the memory storage element coupled to another access line (e.g., a digit line). Top electrode 205-c of memory cell 105-e may be coupled to a digit line 115, for example, and bottom electrode 210-c may be coupled to a word line 110, or vice versa.

In some examples, the area of a top surface 305 and the area of the bottom surface 310 determine a ratio that is configured to define a sense window associated with memory cell 105 by crowding ions at or near the digit line or word line when the memory cell 105 stores a logic state.

More generally, by forming a specific geometric profile (e.g., a taper profile or stepped profile or some other profile) having a particular area of top surface 305, area of bottom surface 310, and ratio between the areas of the top surface 305 and the bottom surface 310, it is possible to define a sense window.

A geometric profile of a memory storage element may be determined by the doping gradient of the memory storage element. For example, if a desired geometric profile is known, a corresponding doping gradient for the memory storage element can be determined and applied such that, after etching, the memory storage element may have the desired taper profile.

FIG. 5 illustrates an example multi-deck memory device 500 that may be formed using dopant-modulated etching in accordance with examples of the present disclosure. Multi-deck memory device 500 may be, for example, a memory device based on a 3D memory array having asymmetric memory cells that may be formed using dopant-modulated etching. Multi-deck memory device 500 includes four decks, with each deck including at least one memory cell 105-*f*, 105-*g*, 105-*h*, 105-*i*, such as memory cell 105-*e* described earlier with respect to FIG. 4A. In some embodiments, a multi-deck memory device may have more than or fewer than four decks. For example, a multi-deck memory device may have 2, 4, 8, or 16 decks, or more.

Memory storage elements 220-*d*, 220-*e*, 220-*f*, 220-*g* have taper profiles. For example, memory storage elements 220-*e*, 220-*g* taper from a bottom surface 310-*e*, 310-*g* to a top surface 305-*e*, 305-*g*. In contrast, memory storage elements 220-*d*, 220-*f* taper from a top surface 305-*d*, 305-*f* to a bottom surface 310-*d*, 310-*f*.

In the example of FIG. 5, the taper profile of a memory storage element (e.g., 220-*d*, 220-*f*) in each deck is a reflection of the taper profile of a memory storage element (e.g., 220-*e*, 220-*g*) in an adjacent deck. Alternating taper profiles across memory decks in this manner may enable the digit lines and word lines that are coupled to memory cells in adjacent decks to be easily shared between decks, while also providing the benefits of an asymmetric geometry described earlier. For example, word line 110-*d* may be coupled to word line 110-*e* and digit line 115-*e* may be coupled to digit line 115-*f* In some examples, word lines (or digit lines) in adjacent decks may be coupled by sharing a single conductive line, or via adjacent conductive lines that are in contact with each other. Sharing conductive lines (such as word lines or digit lines) between memory cells in different decks may reduce the die area associated with fabricating the memory device, or may improve other memory device metrics such as cost, power consumption, or performance.

Memory storage elements 220-*d*, 220-*e*, 220-*f*, 220-*g* have non-uniform doping concentrations corresponding to the taper profiles. For example, as indicated by the grayscale gradient, the doping concentration of the dopant in memory storage element 220-*d* decreases from a first (higher) doping concentration at top surface 305-*d* to a second (lower) doping concentration at bottom surface 310-*d*. In contrast, the doping concentration of the dopant in memory storage element 220-*e* increases from a first doping concentration at top surface 305-*e* to a second doping concentration at bottom surface 310-*e*. In this example, the doping gradient in memory storage element 220-*d* is an inverse of the doping gradient in memory storage element 220-*e*, and vice versa. That is, the doping gradient of 220-*d* is essentially the same as the doping gradient of 220-*f*, except with a gradient that travels in an opposite direction. Alternating one doping gradient with the inverse of the doping gradient of memory storage elements for memory cells in adjacent decks may enable formation of memory cells with alternating taper profiles using dopant-modulated etching.

In some examples, it may be desirable for the geometry of memory storage elements to be consistent across memory cells and across memory decks. Such consistency may yield more uniform and predictable device behavior. In some examples, memory storage elements of memory cells on even-numbered decks (e.g., memory cells 105-*g* and 105-*i*) may all have a first taper profile (and corresponding doping gradient), while memory storage elements on odd decks (e.g., memory cells 105-*f* and 105-*h*) may all have a second taper profile (and corresponding inverse doping gradient) that is a reflection of the first taper profile. In this example, taper profiles for memory storage elements 220-*d*, 220-*e*, 220-*f*, and 220-*g* may be considered to be consistent across decks since a reflected taper profile may provide the same behavior as an un-reflected taper profile.

While the memory device 500 depicted in FIG. 5 depicts memory decks having memory storage elements with alternating taper profiles and correspondingly alternating doping gradients for even-numbered decks and odd-numbered decks, this is not required. For example, memory cells on different decks may have doping gradients that are different from each other, but are not inverses. For example, memory cells on one deck may have a linear doping gradient (e.g., the doping concentration increases or decreases linearly), while memory cells on another deck may have a non-linear doping gradient (e.g., the doping concentration increases or decreases exponentially).

Memory cells on different decks may have asymmetric geometries that are different from each other, but are not reflections of each other. For example, one deck may have memory cells with a trapezoidal shape, while another deck may have memory cells with a conical shape. Doping-modulated etching may be used to form arbitrary geometries on different decks. In some examples, doping-modulated etching may be used to form the same asymmetric geometry on every deck.

Furthermore, it is possible for memory cells within the same deck to have different asymmetric geometries and/or different non-uniform doping concentrations.

In some examples, a memory array may include one or more inactive memory cells; e.g., memory cells that are not used to store information. These inactive memory cells may be, for example, extra memory cells that are located in a border of a memory array or in a dummy region of the memory array. Inactive memory cells may be on the same deck as active memory cells (e.g., memory cells that are used to store information) or on a different deck than active memory cells. Inactive memory cells may be connected to the same access lines as active memory cells or connected to different access lines. As previously noted, a non-uniform doping concentration of a memory cell may be altered by electrical pulses after fabrication; e.g., during read or write operations, during manufacturing, etc. In some cases, such electrical pulses may be applied to active memory cells but not to inactive memory cells. Therefore, in some cases, the doping concentration of active memory cells may be altered, while the doping concentration of inactive memory cells may not be altered. As a result, active and inactive memory cells may have different doping concentrations after the electrical pulses are applied to the active memory cells, even if the active and inactive memory cells were fabricated using the same non-uniform doping concentrations. In this case, active and inactive memory cells may have the same asymmetric geometry but different doping concentrations.

FIG. 6 illustrates an example multi-deck memory device 600 that may be formed using dopant-modulated etching in accordance with examples of the present disclosure. Multi-deck memory device 600 may be a memory device based on a 3D memory array having tapered memory cells that may be formed using dopant-modulated etching. Multi-deck memory device 600 includes four decks, each deck having at least one memory cell 105-$j$, 105-$k$, 105-$l$, 105-$m$ such as memory cell 105-$e$ described earlier with respect to FIG. 4A. In this example, unlike the example depicted in FIG. 5, memory storage elements 220-$h$, 220-$i$, 220-$j$, 220-$k$ in different decks all have the same taper profile, rather than alternating between a taper profile on one deck and a reflection of the taper profile on an adjacent deck. Similarly, in this example, the corresponding doping gradient may be the same for memory storage elements 220-$h$, 220-$i$, 220-$j$, 220-$k$ rather than alternating between a doping gradient on one deck and an inverse of the doping gradient on another deck.

In some examples, a multi-deck memory device 500, 600 may be formed in a manner such as described with respect to FIGS. 3 and 4A. A doping profile for each memory storage element in a multi-deck device may be determined based on the desired taper profile for each memory storage element. The memory storage element of each memory cell may be doped with a non-uniform doping concentration along the direction between the word line and the digit line such that the doping concentration is higher at the surface of the memory storage element that is coupled to one access line (e.g., a word line) than at the surface of the memory storage element that is coupled to another access line (e.g., a digit line).

While the examples of FIGS. 3-6 depict memory storage elements having essentially trapezoidal shapes, a person of skill in the art will appreciate that many other shapes or taper profiles may be appropriate. For example, a memory storage element may have a triangular prism shape, a pyramidal shape, a conical shape (e.g., a taper profile having curved edges), etc.

Further, while the examples of FIGS. 3-6 depict memory storage elements with smooth taper profiles, other geometries are possible, such as geometries that do not smoothly or continuously taper between a top surface and a bottom surface.

FIG. 7 illustrates an example memory cell 105-$n$ that may be formed using dopant-modulated etching in accordance with examples of the present disclosure. Rather than a smooth taper profile, memory storage element 220-$l$ of memory cell 105-$n$ may have, after etching, a stepped profile with a first portion 705 of memory storage element 220-$l$ having a first width 315-$d$ and a corresponding first doping concentration and a second portion 710 of memory storage element 220-$l$ having a second width 315-$e$ and a corresponding second doping concentration.

Memory cell 105-$n$ may be formed using doping-modulated etching in a manner similar to that described earlier with respect to FIGS. 3-4. For example, a first portion 705 of memory storage element 220-$l$ may be uniformly doped with a first concentration of the dopant, and a second portion 710 of memory storage element 220-$l$ may be uniformly doped with a second (lower) concentration of the dopant. The relative doping concentrations of the first portion and the second portion may be determined based on the desired relative widths, or based on a desired ratio of an area of a bottom surface 310-$h$ of the first portion 705 coupled to electrode 210-$h$ and an area of a top surface 305-$h$ of the second portion 710 coupled to electrode 205-$h$. Memory cell 105-$n$ may then be etched. In some examples, a first portion 705 of memory storage element 220-$l$ having a higher doping concentration may have a lower etching rate than a second portion 710 having a lower doping concentration, resulting in a first width 315-$d$ that is wider than the second width 315-$e$, as depicted in FIG. 7. Memory storage element 220-$l$ may be coupled to access lines via electrodes 205-$h$, 210-$h$ for example.

Figure 11:
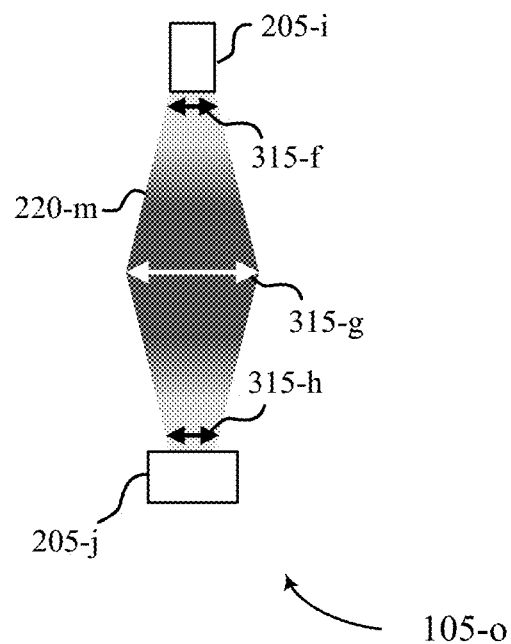
FIG. 11. illustrates example memory cells that may be formed using dopant-modulated etching in accordance with examples of the present disclosure.
Figure 11:
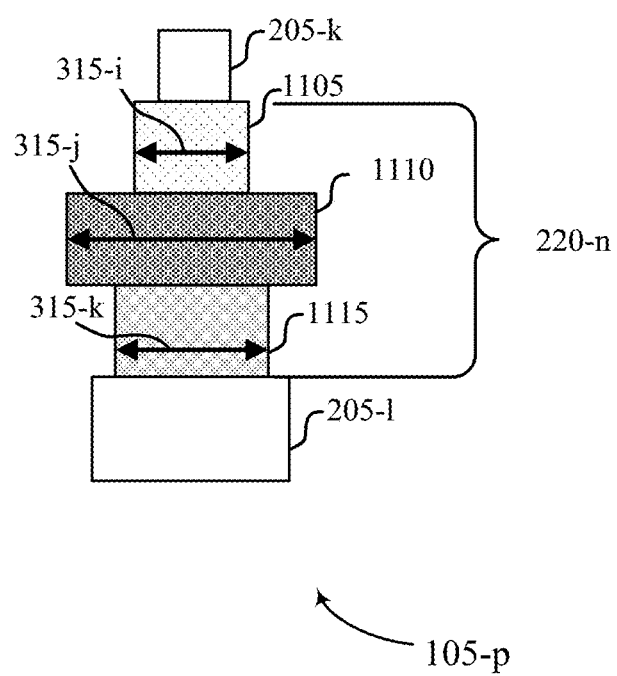

While the example of FIG. 7 depicts a memory storage element having two portions, each with a different width corresponding to a different doping concentration, a person of skill in the art will appreciate that a similar approach may be used to fabricate a memory cell having a memory storage element with three or more portions, each of which may have a different width corresponding to a different doping concentration, such as depicted in an example of FIG. 11. Further, the approach depicted in FIG. 7 may be combined with the approach depicted in FIGS. 3-6, so that a first portion has a non-uniform doping concentration, and a second portion has a uniform doping concentration, etc.

Figure 8:
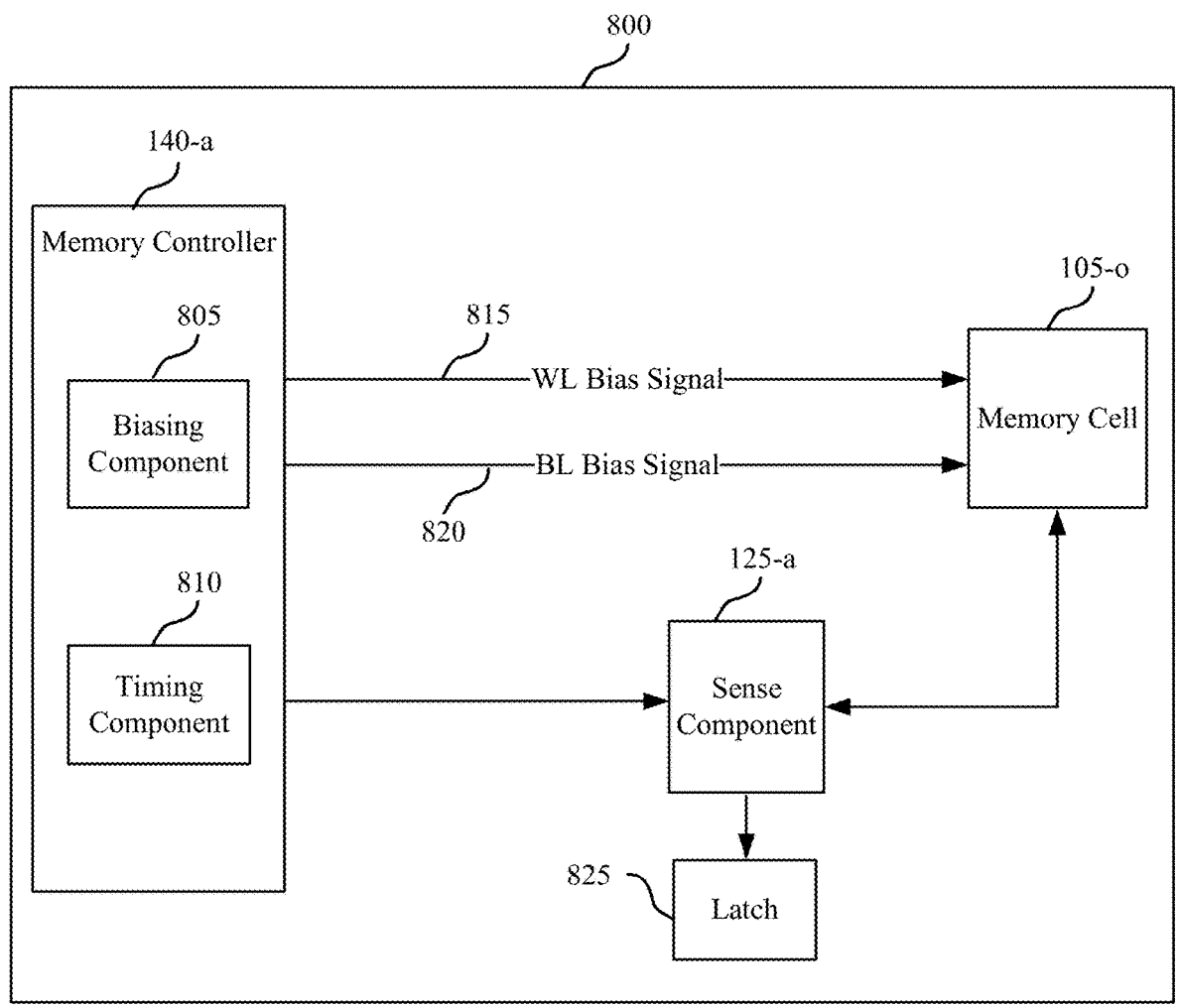
FIG. 8 illustrates an example memory array that may include memory cells formed using doping-modulated etching in accordance with examples of the present disclosure.

FIG. 8 illustrates an example memory array 800 that may include memory cells formed using doping-modulated etching in accordance with examples of the present disclosure. Memory array 800 may include one or more memory cells formed using dopant-modulated etching, in accordance with examples of the present disclosure. Memory array 800 may be referred to as an electronic memory apparatus, and may be an example of a component of a memory controller 140 as described with reference to FIG. 1.

Memory array 800 may include one or more memory cells 105-$o$, memory controller 140-$a$, word line (not shown), sense component 125-$a$, digit line (not shown), and latch 825. These components may be in electronic communication with each other and may perform one or more of the functions described herein. In some cases, memory controller 140-$a$ may include biasing component 805 and timing component 810. Memory controller 140-$a$ may be in electronic communication with word line, digit line, and sense component 125-$a$, which may be examples of word line 110, digit line 115, and sense component 125, described with reference to FIGS. 1 and 2. In some cases, sense component 125-$a$ and latch 825 may be components of memory controller 140-$a$.

Memory cell 105-$o$ may include a memory storage element with an asymmetric shape, such as a tapered profile or stepped profile. For example, memory cell 105-$o$ may be an example of a memory cell 105-$e$ described with reference to FIG. 4A or memory cell 105-$n$ described with reference to FIG. 7.

In some examples, the digit line is in electronic communication with sense component 125-$a$ and memory cell 105-$o$. A logic state (e.g., a first or second logic state) may be written to memory cell 105-$o$. The word line may be in electronic communication with memory controller 140-$a$ and memory cell 105-$o$. Sense component 125-$a$ may be in electronic communication with memory controller 140-$a$, digit line, and latch 825. These components may also be in electronic communication with other components, both inside and outside of memory array 100-$a$, in addition to components not listed above, via other components, connections, or busses.

Memory controller 140-$a$ may be configured to activate a word line or a digit line by applying voltages to those various nodes. For example, biasing component 805 may be configured to apply a voltage to operate memory cell 105-$o$ to read or write memory cell 105-*o* as described above. In some cases, memory controller 140-*a* may include a row decoder, column decoder, or both, as described with reference to FIG. 1. This may enable the memory controller 140-*a* to access one or more memory cells 105-*o*. Biasing component 805 may provide a voltage for the operation of sense component 125-*a*. Memory controller 140-*a* may send a word line bias signal 815 to memory cell 105-*o* via a word line, and/or may send a bit line bias 820 signal to memory cell 105-*o* via a bit line.

In some cases, memory controller 140-*a* may perform its operations using timing component 810. For example, timing component 810 may control the timing of the various word line selections or plate biasing, including timing for switching and voltage application to perform the memory functions, such as reading and writing, discussed herein. In some cases, timing component 810 may control the operations of biasing component 805.

Upon determining a logic state of memory cell 105-*o*, sense component 125-*a* may store the output in latch 825, where it may be used in accordance with the operations of an electronic device that memory array 100-*a* is a part. Sense component 125-*a* may include a sense amplifier in electronic communication with the latch and memory cell 105-*o*.

In some examples memory controller 140-*a* may include means for increasing a local concentration of a chemical element at a first surface of a chalcogenide material memory storage component to store a first logic value and means for increasing a concentration of the element at a second surface of the chalcogenide material memory storage component to store a second logic value different from the first value, wherein the first surface is opposite the second surface.

In some examples of the methods and apparatus described above, the second surface may have an area greater than an area of the first surface. Further, the concentration of a dopant at the first surface may be greater than the concentration of the dopant at the second surface, and a concentration of a chemical element at the first surface may be greater than the concentration of the chemical element at the second surface. Some examples of the method and apparatus described above may further include processes, features, means, or instructions for fabricating memory cell 105-*o* with a memory storage element having an asymmetric geometry or taper profile, and/or having a non-uniform doping concentration of a dopant.

Memory controller 140-*a*, or at least some of its various sub-components may be implemented in hardware, software executed by a processor, firmware, or any combination thereof. If implemented in software executed by a processor, the functions of the memory controller 140-*a* and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure.

The memory controller 140-*a* and/or at least some of its various sub-components may be physically located at various positions, including being distributed such that portions of functions are implemented at different physical locations by one or more physical devices. In some examples, memory controller 140-*a* and/or at least some of its various sub-components may be a separate and distinct component in accordance with various examples of the present disclosure. In other examples, memory controller 140-*a* and/or at least some of its various sub-components may be combined with one or more other hardware components, including but not limited to a receiver, a transmitter, a transceiver, one or more other components described in the present disclosure, or a combination thereof in accordance with various examples of the present disclosure.

Figure 9:
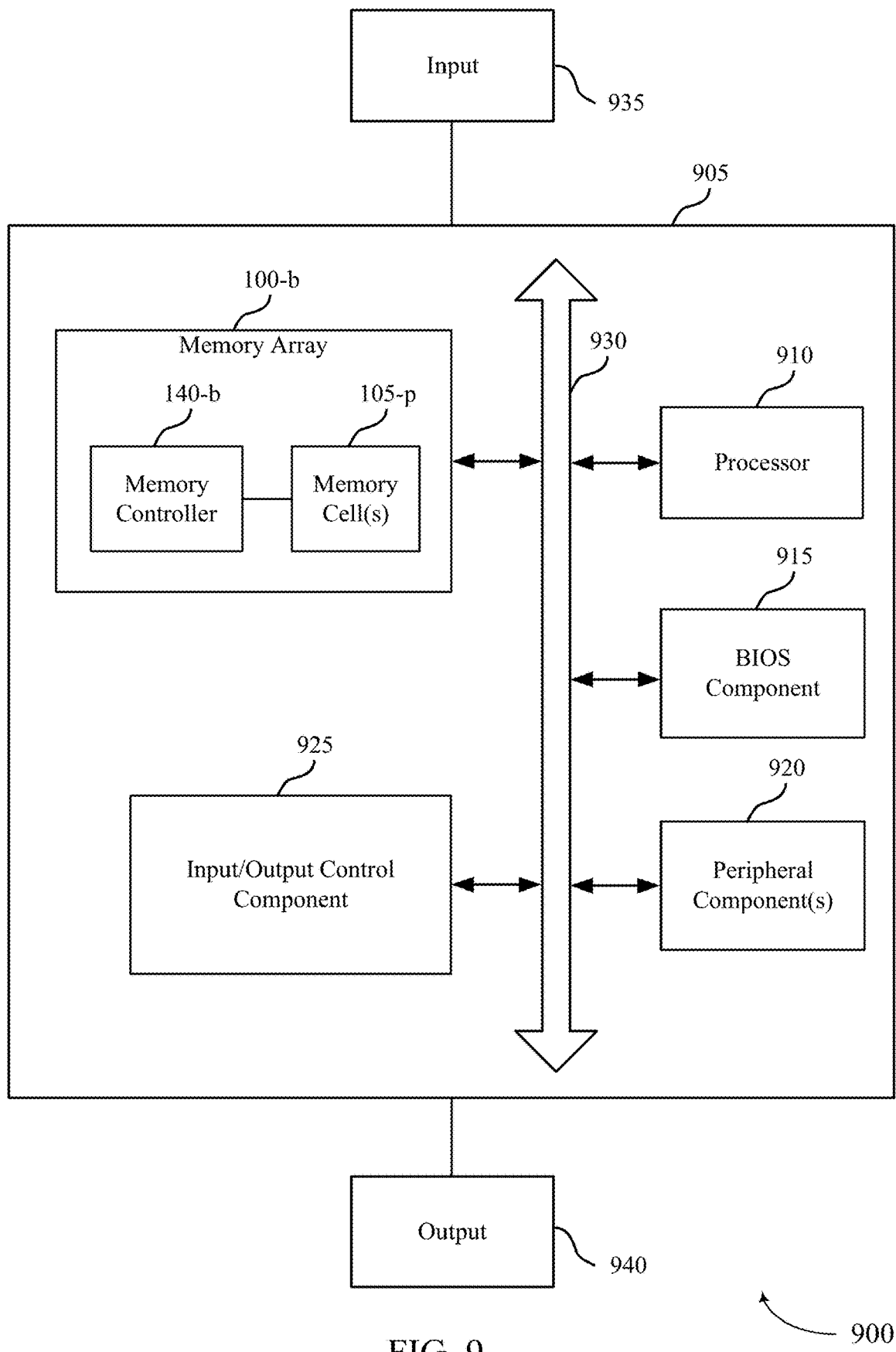
FIG. 9 illustrates a device including a memory array with memory cells that may be formed using doping-modulated etching in accordance with examples of the present disclosure.

FIG. 9 shows an example diagram of a system 900 including a device 905 that may be formed using dopant-modulated etching in accordance with various examples of the present disclosure. Device 905 may be an example of or include the components of memory controller 140 as described above, with reference to FIG. 1. Device 905 may include components for bi-directional voice and data communications including components for transmitting and receiving communications, including memory array 100-*b* that includes memory controller 140-*b* and memory cells 105-*p*, basic input/output system (BIOS) component 915, processor 910, I/O controller 925, and peripheral components 920. These components may be in electronic communication via one or more busses (e.g., bus 930).

Memory cells 105-*p* may store information (i.e., in the form of a logical state) as described herein. Memory cells 105-*p* may be SSM cells with a memory storage element as described with reference to FIG. 4, for example.

BIOS component 915 may be a software component that includes BIOS operated as firmware, which may initialize and run various hardware components. BIOS component 915 may also manage data flow between a processor and various other components, for example, peripheral components, input/output control component, etc. BIOS component 915 may include a program or software stored in read only memory (ROM), flash memory, or any other non-volatile memory.

Processor 910 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 910 may be configured to operate a memory array using a memory controller. In other cases, a memory controller may be integrated into processor 910. Processor 910 may be configured to execute computer-readable instructions stored in a memory to perform various functions (e.g., functions or tasks supporting programming enhancement in self-selecting memory).

I/O controller 925 may manage input and output signals for device 905. I/O controller 925 may also manage peripherals not integrated into device 905. In some cases, I/O controller 925 may represent a physical connection or port to an external peripheral. In some cases, I/O controller 925 may utilize an operating system such as iOS®, ANDROID®, MS-DOS®, MS-WINDOWS®, OS/2®, UNIX®, LINUX®, or another known operating system.

Peripheral components 920 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 935 may represent a device or signal external to device 905 that provides input to device 905 or its components. This may include a user interface or an interface with or between other devices. In some cases, input 935 may be managed by I/O controller 925, and may interact with device 905 via a peripheral component 920.

Output 940 may also represent a device or signal external to device 905 configured to receive output from device 905 or any of its components. Examples of output 940 may include a display, audio speakers, a printing device, another processor or printed circuit board, etc. In some cases, output 940 may be a peripheral element that interfaces with device 905 via peripheral component(s) 920. In some cases, output 940 may be managed by I/O controller 925.

The components of device 905 may include circuitry designed to carry out their functions. This may include various circuit elements, for example, conductive lines, transistors, capacitors, inductors, resistors, amplifiers, or other active or inactive elements, configured to carry out the functions described herein. Device 905 may be a computer, a server, a laptop computer, a notebook computer, a tablet computer, a mobile phone, a wearable electronic device, a personal electronic device, or the like. Or device 905 may be a portion or component of such a device.

Figure 10:
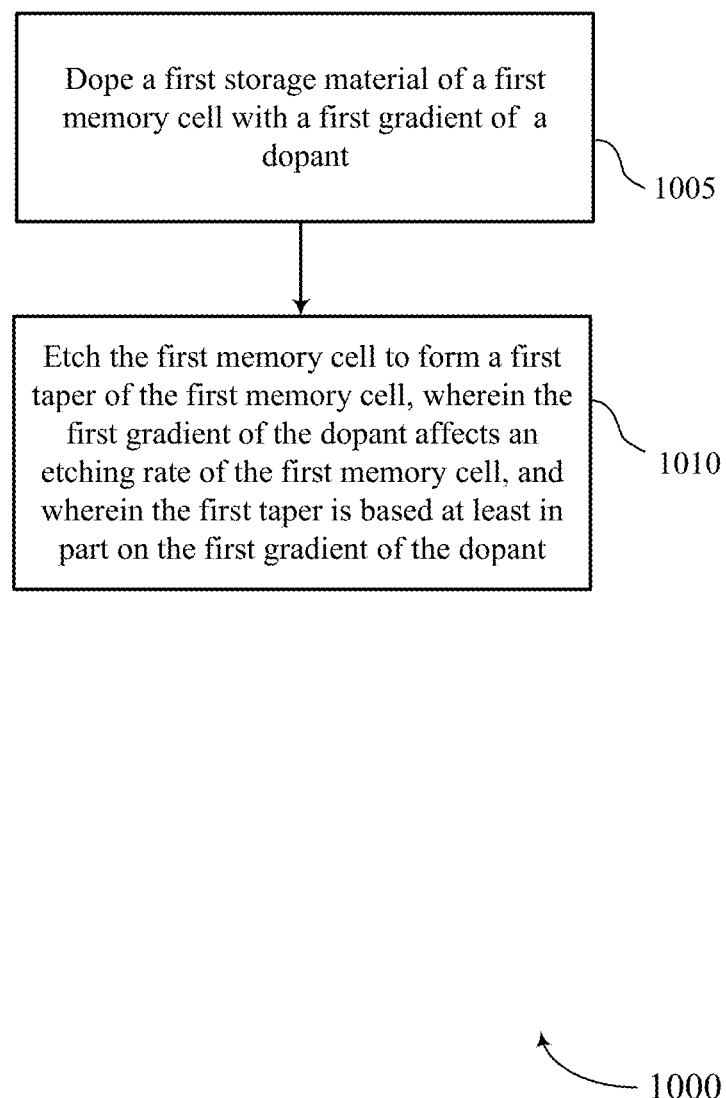
FIG. 10 is a flowchart that illustrates a method or methods for forming a memory device with asymmetric memory cells using dopant-modulated etching in accordance with examples of the present disclosure.

FIG. 10 is a flowchart that illustrates a method or methods 1000 for forming a memory device with asymmetric memory cells (e.g., memory cells having memory storage elements with asymmetric geometries) using dopant-modulated etching in accordance with examples of the present disclosure. Memory cells may be formed by doping a first storage material of a first memory cell with first doping gradient of a dopant, and etching the first memory cell to form the first taper of the first memory cell, wherein the first doping gradient of the dopant affects an etching rate of the first memory cell, and wherein the taper is based at least on the dopant. A doping gradient may be determined by a computer program based on a desired taper profile, for example. A memory storage element may be doped by appropriate doping apparatus, which may include apparatus for sputtering, co-sputtering, or implantation, for example. A memory storage element may be etched by appropriate etching apparatus, which may include apparatus for chemical etching, plasma etching, or chemical-mechanical planarization.

At block 1005, the method 1000 may dope a first memory storage element of a first memory cell with a first gradient of a dopant. In some cases, the first memory cell is coupled to a first access line and a second access line (e.g., a first word line and a first digit line) and the first memory storage element is doped with a first non-uniform doping concentration of the dopant in a first direction between the first access line and the second access line. In some examples, the method may include doping a second memory storage element of a second memory cell with a second gradient of the dopant. In some cases, the second memory cell is coupled to a third access line and a fourth access line (e.g., a second word line and a second digit line) and the second memory storage element is doped with a second non-uniform doping concentration of the dopant in a second direction between the third access line and the fourth access line. In some cases, the first gradient and the second gradient are the same gradient, and the first memory cell is an active memory cell and the second memory cell is an inactive memory cell, and the method includes applying one or more electrical pulses to the first memory cell without applying the one or more electrical pulses to the second memory cell. In some cases, applying the one or more electrical pulses to the first memory cell changes the first gradient of the dopant to a concentration of the dopant that is different than the second gradient.

At block 1010, the method 1000 may etch the first memory cell to form a first taper of the first memory cell. In some examples, the first gradient of the dopant affects an etching rate of the first memory cell, and the first taper is based at least in part on the first gradient of the dopant. In some cases, the method may etch the second memory storage element to form the second taper of the second memory cell. In some cases, the second gradient of the dopant affects an etching rate of the second memory cell, and the second taper is based at least on the second gradient of the dopant.

An apparatus for performing the method 1000 is described. The apparatus may include means for doping a first storage material of a first memory cell with a first gradient of a dopant, and means for etching the first memory cell to form the first taper of the first memory cell, wherein the first gradient of the dopant affects an etching rate of the first memory cell, and wherein the first taper profile is based at least in part on the first doping gradient.

While the examples described earlier focus on taper profiles and/or doping gradients that may monotonically increase or decrease in a given direction, this is not required. For example, if the desired profile/shape of a memory storage element includes an hourglass shape, the corresponding non-uniform doping concentration that may be used to modulate the etching process may vary non-monotonically along the direction between the top surface and the bottom surface of the memory storage element, with a higher concentration at either end of the hourglass shape relative to a lower concentration in the middle of the hourglass shape. Similarly, for a barrel-like taper profile, in which the storage memory element tapers from a wider middle portion to narrower ends at the top surface and bottom surface, the corresponding non-uniform doping concentration that may be used to modulate the etching process may vary non-monotonically along the direction between the top surface and the bottom surface, with a lower concentration at both ends of the barrel shape relative to a higher concentration in the middle of the barrel shape.

In some cases, a barrel-like taper profile may be beneficial. For example, when a memory cell is programmed using a given polarity, anions may drift towards one surface (e.g., a top or bottom surface) of a memory storage element and cations may drift towards the opposite surface (e.g., a bottom or top surface) of the memory storage element. As compared with symmetrically shaped memory cells, a memory storage element having a barrel-like taper profile, or another asymmetric profile in which the widths of the top and bottom surfaces of the memory storage element are narrower than the width of a middle portion of the memory storage element, may cause an increase in the concentrations of the cations and/or anions at the respective surfaces, by having narrow contact areas at each electrode and a larger, bulk ion reservoir at the middle of the memory storage element, for example.

FIG. 11 illustrates example memory cells 105-*o*, 105-*p* that may be formed using dopant-modulated etching in accordance with examples of the present disclosure. Memory cells 105-*o*, 105-*p* provide examples of asymmetric geometries in which the widths of the top and bottom surfaces of the memory storage element are narrower than the width of a middle portion of the memory storage element. Memory cells 105-*o* and 105-*p* have memory storage element profiles that may result in anion crowding at one surface of the memory storage element and cation crowding at the opposite surface, or vice versa, depending on the polarity of the operation.

The memory storage element 220-*m* of memory cell 105-*o* provides an example of a barrel-like taper profile, with a wider width 315-*g* near the middle of the memory storage element, and narrower widths 315-*f*, 315-*h* near the surfaces of the memory storage element 220-*m* that are coupled with electrodes 205-*i*, 205-*j*. In some cases, the width 315-*f* is similar to the width 315-*h*. In some cases, the width 315-*f* is different than the width 315-*h*. The corresponding non-uniform doping concentration is higher near the middle of the memory storage element and decreases towards the top and bottom surfaces of the memory storage element. Memory storage element 220-*l* may be coupled to access lines (e.g., a word line and a digit line) via electrodes 205-*i*, 205-*j*, for example.

The memory storage element 220-*n* of memory cell 105-*o* provides an example of a stepped memory storage element with a stepped profile having a first (middle) portion 1110 with a wider width 315-*j* relative to second and third portions 1105, 1115 that have narrower widths 315-*i*, 315-*k* near the top and bottom surfaces of memory storage element 220-*n*. The first portion 1110 may have a higher doping concentration than the doping concentrations of the second and third portions 1105, 1115. In this example, the second and third portions 1105, 1115 have different widths 315-*i*, 315-*k*, and correspondingly, different doping concentrations. In other examples, the second and third portions may have the same width and the same doping concentration. Memory storage element 220-*n* may be coupled to access lines (e.g., a word line and a digit line) via electrodes 205-*k*, 205-*l*, for example.

It should be noted that the methods described above describe possible implementations, and that the operations and the steps may be rearranged or otherwise modified and that other implementations are possible. Further, features or steps from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refers to a relationship between components that supports electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping of the semiconductor substrate may be performed during the initial formation or growth of the substrate, by ion-implantation, or by any other doping means.

Chalcogenide materials may be materials or alloys that include at least one of the elements sulfur (S), selenium (Se), and tellurium (Te). Phase change materials discussed herein may be chalcogenide materials. Chalcogenide materials and alloys may include, but not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

As described herein, in addition to the above-described doping of the semiconductor substrate, the chalcogenide material in a memory cell may be doped with a dopant that affects the etching rate of the memory cell during a subsequent etching step. In some examples, the chalcogenide material in a memory cell may be doped with a dopant in a manner that does not substantially alter the conductivity of the memory cell. For example, the chalcogenide material may be doped with indium at a concentration that does not substantially affect the migration of ions within the chalcogenide material.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
doping a first memory storage element of a first memory cell with a first gradient of a dopant; and
etching the first memory storage element to form a first taper of the first memory cell, wherein the first gradient of the dopant affects an etching rate of the first memory cell, and wherein the first taper is based at least in part on the first gradient of the dopant.

2. The method of claim 1, further comprising:
doping a second memory storage element of a second memory cell with a second gradient of the dopant; and
etching the second memory storage element to form a second taper of the second memory cell, wherein the second gradient of the dopant affects an etching rate of the second memory cell, and wherein the second taper is based at least in part on the second gradient of the dopant.

3. The method of claim 2, wherein the first memory cell is in a first memory deck and the second memory cell is in a second memory deck.

4. The method of claim 2, wherein the first taper of the first memory cell is different than the second taper of the second memory cell.

5. The method of claim 2, wherein the first taper of the first memory cell and the second taper of the second memory cell have a same taper profile.

6. The method of claim 2, wherein the first memory cell is coupled to a first access line and to a second access line, and wherein doping the first memory storage element includes a first non-uniform doping concentration of the dopant in the first memory storage element in a first direction between the first access line and the second access line.

7. The method of claim 6, wherein the second memory cell is coupled to a third access line and to a fourth access line, and wherein doping the second memory storage element comprises doping the second memory storage element with a second non-uniform doping concentration of the dopant in the second memory storage element in a second direction between the third access line and the fourth access line.

8. The method of claim 2, wherein the first taper of the first memory cell is different than the second taper of the second memory cell.

9. The method of claim 2, wherein the first memory storage element and the second memory storage element each include a chalcogenide material.

10. The method of claim 2, wherein the first gradient and the second gradient have a same gradient profile, and wherein the first memory cell is an active memory cell and the second memory cell is an inactive memory cell, the method further comprising:
applying one or more electrical pulses to the first memory cell without applying the one or more electrical pulses to the second memory cell, wherein applying the one or more electrical pulses changes the first gradient of the dopant to a concentration of the dopant that is different than the second gradient.

11. The method of claim 2, further comprising:
forming a multi-deck memory device in which the first memory cell is in a first memory deck and the second memory cell is in a second memory deck.

12. The method of claim 11, wherein the first taper of the first memory cell tapers in an opposite direction to the second taper of the second memory cell.

13. The method of claim 1, wherein the first memory cell is coupled to a first access line and to a second access line, and wherein doping the first memory storage element comprises doping the first memory storage element with a first non-uniform doping concentration of the dopant in the first memory storage element in a first direction between the first access line and the second access line.

14. The method of claim 1, wherein the first gradient monotonically increases in a first direction.

15. The method of claim 1, wherein the first memory cell has a trapezoidal prism shape.

16. A method, comprising:
doping a first memory storage element of a first memory cell with a first gradient and a second gradient of a dopant; and
etching the first memory storage element to form a first taper and a second taper of the first memory cell, wherein the first gradient and the second gradient of the dopant affect an etching rate of the first memory cell, and wherein the first taper and the second taper are respectively based at least in part on the first gradient and the second gradient of the dopant.

17. The method of claim 16, wherein the first taper and the second taper of the first memory cell taper in opposite directions.

18. The method of claim 17, wherein the first memory cell has an hourglass profile.

19. The method of claim 17, wherein the first taper and the second taper of the first memory cell taper from a wider middle portion to opposite ends of the first memory cell.

* * * * *